(12) United States Patent
Kato

(10) Patent No.: US 9,570,116 B2
(45) Date of Patent: Feb. 14, 2017

(54) SEMICONDUCTOR DEVICE, MEMORY DEVICE, AND ELECTRONIC DEVICE

(71) Applicant: Semiconductor Energy Laboratory Co., Ltd., Atsugi-shi, Kanagawa-ken (JP)

(72) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/963,434

(22) Filed: Dec. 9, 2015

(65) Prior Publication Data

US 2016/0172010 A1 Jun. 16, 2016

(30) Foreign Application Priority Data

Dec. 11, 2014 (JP) ................................ 2014-250551

(51) Int. Cl.

| G11C 5/06 | (2006.01) |
|---|---|
| G11C 11/419 | (2006.01) |
| G11C 7/10 | (2006.01) |
| G11C 11/24 | (2006.01) |
| G11C 11/4096 | (2006.01) |
| G11C 11/4094 | (2006.01) |
| G11C 5/14 | (2006.01) |
| G11C 5/10 | (2006.01) |

(Continued)

(52) U.S. Cl.
CPC . *G11C 5/10* (2013.01); *G11C 5/06* (2013.01); *G11C 11/24* (2013.01); *G11C 11/4074* (2013.01); *G11C 11/4091* (2013.01); *G11C 11/4096* (2013.01); *G11C 11/419* (2013.01)

(58) Field of Classification Search
CPC .......... G11C 5/06; G11C 11/419; G11C 11/24; G11C 11/4091; G11C 11/4096; G11C 11/4074
USPC ....................................... 365/51, 63, 72, 149
See application file for complete search history.

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| CN | 102403021 A | 4/2012 |
|---|---|---|
| CN | 102804360 A | 11/2012 |

(Continued)

OTHER PUBLICATIONS

International Search Report (Application No. PCT/IB2015/059232) Dated Mar. 15, 2016.

(Continued)

*Primary Examiner* — Ly D Pham
(74) *Attorney, Agent, or Firm* — Fish & Richardson P.C.

(57) ABSTRACT

To provide a small, highly reliable memory device with a large storage capacity. A semiconductor device includes a circuit for retaining data and a circuit for reading data. The circuit for retaining data includes a transistor and a capacitor. The circuit for reading data is configured to supply a potential to the circuit for retaining data and read a potential from the circuit for retaining data. The circuit for retaining data and the circuit for reading data are provided in different layers, so that the semiconductor device with a large storage capacity is manufactured.

22 Claims, 27 Drawing Sheets

(51) Int. Cl.
    *G11C 11/4091* (2006.01)
    *G11C 11/4074* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,873,009 B2 | 3/2005 | Hisamoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,339,828 B2 | 12/2012 | Yamazaki et al. |
| 8,358,530 B2 | 1/2013 | Kamata |
| 8,363,452 B2 | 1/2013 | Yamazaki et al. |
| 8,411,480 B2 | 4/2013 | Nagatsuka et al. |
| 8,520,426 B2 | 8/2013 | Ohnuki |
| 8,542,528 B2 | 9/2013 | Sekine et al. |
| 8,569,753 B2 | 10/2013 | Isobe et al. |
| 8,614,916 B2 | 12/2013 | Nagatsuka et al. |
| 8,837,203 B2 * | 9/2014 | Shionoiri ............ H01L 21/84 365/129 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0209739 A1 | 11/2003 | Hisamoto et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0128777 A1 | 6/2011 | Yamazaki et al. |
| 2011/0156027 A1 | 6/2011 | Yamazaki et al. |
| 2011/0194327 A1 | 8/2011 | Kawae |
| 2011/0194331 A1 | 8/2011 | Kawae et al. |
| 2011/0227062 A1 | 9/2011 | Kato et al. |
| 2011/0228584 A1 | 9/2011 | Takemura |
| 2012/0032164 A1 | 2/2012 | Ohnuki |
| 2012/0057397 A1 | 3/2012 | Ohnuki |
| 2012/0063205 A1 * | 3/2012 | Matsuzaki ............ G11C 8/08 365/149 |
| 2012/0153276 A1 | 6/2012 | Kamata |
| 2012/0275245 A1 | 11/2012 | Sekine et al. |
| 2012/0287700 A1 | 11/2012 | Takemura |
| 2012/0294070 A1 | 11/2012 | Matsuzaki et al. |
| 2015/0256156 A1 | 9/2015 | Kozuma et al. |

FOREIGN PATENT DOCUMENTS

| | | |
|---|---|---|
| EP | 1737044 | 12/2006 |
| EP | 2226847 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-028443 A | 1/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-135065 A | 7/2011 |
| JP | 2011-151383 A | 8/2011 |
| JP | 2011-216878 A | 10/2011 |

(56) References Cited

FOREIGN PATENT DOCUMENTS

| | | | |
|---|---|---|---|
| JP | 2012-079400 A | 4/2012 | |
| JP | 2012-256400 A | 12/2012 | |
| JP | 2012-256816 A | 12/2012 | |
| JP | 2015-181228 A | 10/2015 | |
| KR | 2012-0022612 A | 3/2012 | |
| KR | 2012-0026001 A | 3/2012 | |
| KR | 2012-0094067 A | 8/2012 | |
| KR | 2012-0094146 A | 8/2012 | |
| KR | 2013-0004592 A | 1/2013 | |
| WO | WO-00/70683 | 11/2000 | |
| WO | WO-2004/114391 | 12/2004 | |
| WO | WO-2011/065258 | 6/2011 | |
| WO | WO-2011/077967 | 6/2011 | |
| WO | WO-2011/114867 | 9/2011 | |

OTHER PUBLICATIONS

Written Opinion (Application No. PCT/IB2015/059232) Dated Mar. 15, 2016.
Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04: SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08: SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the $In_2O_3$—$Ga_2ZnO_4$—$ZnO$ system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08: SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09: SID International Symposium Digest of Technical Papers, May 31, 2009, vol. 40, pp. 899-902.
Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW'02: Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back Plane,", SID Digest '09: SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09: SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTs,", IDW '09: Proceedings of the 16th International Display Workshops, 2009, pp. 689-692.
Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by PEALD Grown ZNO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09: SID International Symposium Digest of Techincal Papers, May 31, 2009, pp. 1110-1112.
Ohara.H et al., "21.3:4.0 In. QVGA AMOLED Display Using In-Ga-Zn-Oxide TFTs With a Novel Passivation Layer,", SID Digest '09: SID International Symposium Digest of Technical Papers, May 31, 2009, pp. 284-287.
Miyasaka.M, "SUFTLA Flexible Microelectronics on Their Way to Business,", SID Digest '07: SID International Symposium Digest of Technical Papers, 2007, vol. 38, pp. 1973-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.
Lee.H et al., "Current Status of, Challenges to, and Perspective View of AM-OLED,", IDW '06: Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A: Fe, Ga or Al: B: Mg, Mn, Fe, Ni, Cu or Zn]at Temperatures over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.
Janotti.A et al., "Oxygen Vacancies in ZnO,", Appl. Phys. Lett. (Applied Physics Letters), 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW'08: Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

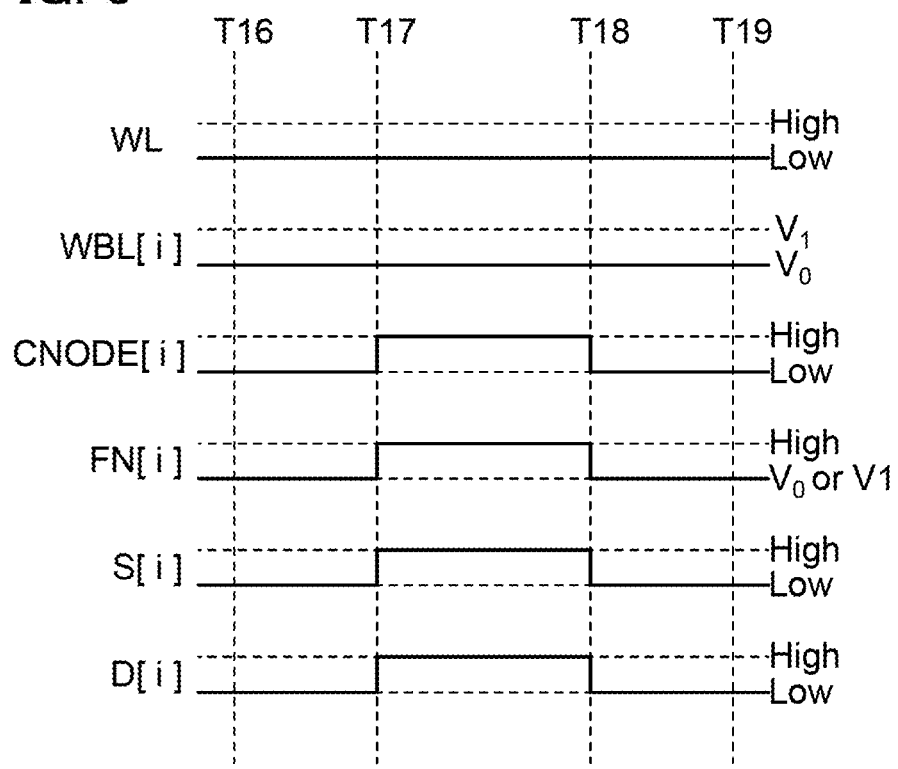

FIG. 21A out-of-plane method CAAC-OS
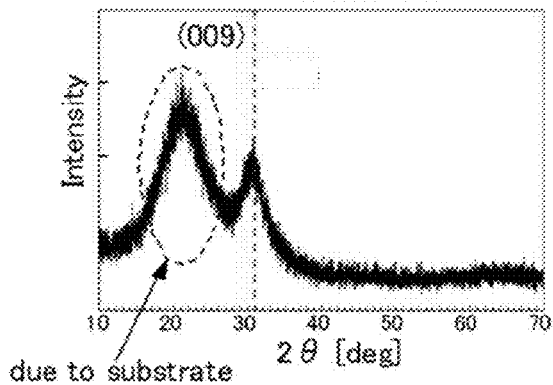
FIG. 21B
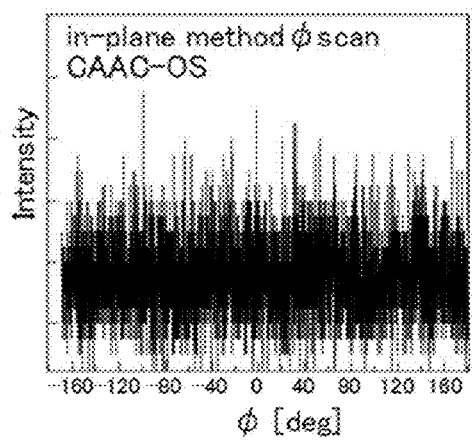
FIG. 21C in-plane method φ scan single crystal OS
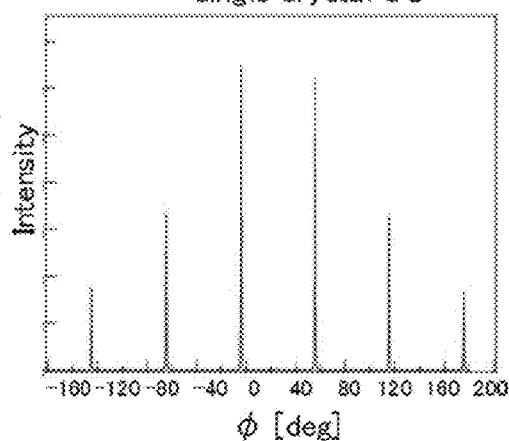
FIG. 21D
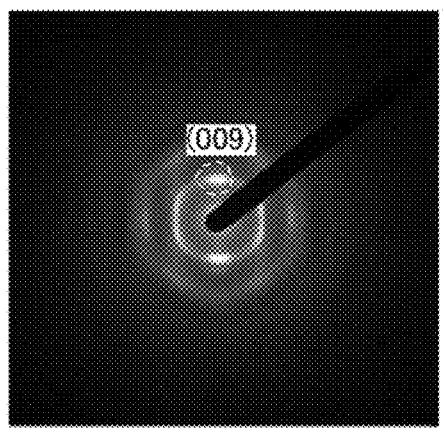
FIG. 21E
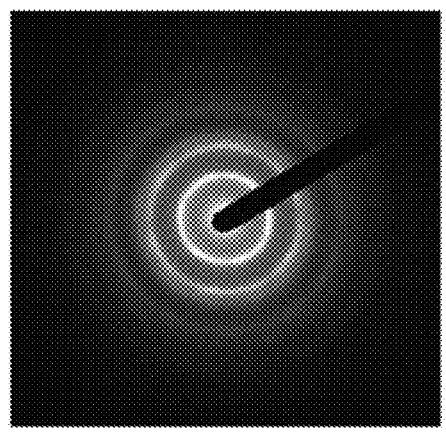

SEMICONDUCTOR DEVICE, MEMORY DEVICE, AND ELECTRONIC DEVICE

TECHNICAL FIELD

One embodiment of the present invention relates to a semiconductor device, a memory device, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

BACKGROUND ART

In recent years, display devices have been used in various electronic devices such as television receivers, personal computer monitors, and smart phones, and the performance of the display devices has been improved to achieve higher definition, lower power consumption, and other various objectives.

In addition, semiconductor devices such as central processing units (CPUs), memories, and sensors have been used in various electronic devices such as personal computers, smart phones, and digital cameras. The performance of the semiconductor devices has also been improved to achieve miniaturization, lower power consumption, and other various objectives.

One of the ways that have been proposed to achieve higher performance such as higher definition, lower power consumption, and miniaturization is the use of an oxide semiconductor for a semiconductor layer (hereinafter also referred to as an active layer, a channel layer, or a channel formation region) of a transistor in a semiconductor device. An example of the transistor includes an oxide of indium, gallium, and zinc (hereinafter also referred to as an In—Ga—Zn oxide) for a channel layer (see Patent Document 1).

Patent Document 2 discloses a memory device including an oxide semiconductor transistor and a single crystal silicon transistor.

REFERENCES

Patent Documents

[Patent Document 1] Japanese Translation of PCT International Application No. H11-505377
[Patent Document 2] Japanese Published Patent Application No. 2012-256400

DISCLOSURE OF INVENTION

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a novel semiconductor device, a novel memory device, a novel module, a novel electronic device, and the like.

Another object of one embodiment of the present invention is to provide a semiconductor device with a large storage capacity. Another object of one embodiment of the present invention is to provide a semiconductor device with a low power consumption. Another object of one embodiment of the present invention is to provide a highly reliable semiconductor device.

Note that the objects of one embodiment of the present invention are not limited to the above objects. The objects described above do not disturb the existence of other objects. The other objects are ones that are not described above and will be described below. The other objects will be apparent from and can be derived from the description of the specification, the drawings, and the like by those skilled in the art. One embodiment of the present invention solves at least one of the above objects and the other objects. One embodiment of the present invention need not solve all the aforementioned objects and the other objects.

(1)

One embodiment of the present invention is a semiconductor device including a first circuit. The first circuit includes a first input terminal, a first output terminal, a first transistor, and a second circuit. The second circuit includes a second to a (2n+1)th transistor, a first to an n-th capacitor, a first wiring, a first to an n-th storage node (n is an integer of 2 or more). A gate of a 2i-th transistor is electrically connected to the first wiring (i is an integer of 1 to n), a first terminal of the 2i-th transistor is electrically connected to a gate of a (2i+1)th transistor and a first terminal of an i-th capacitor through an i-th storage node. The first input terminal is electrically connected to a first terminal of the first transistor. A second terminal of the first transistor is electrically connected to a first terminal of a third transistor. A second terminal of a (2i−1)th transistor is electrically connected to a first terminal of the (2i+1)th transistor. A second terminal of the (2n+1)th transistor is electrically connected to the first output terminal.

(2)

Another embodiment of the present invention is a semiconductor device including a first circuit. The first circuit includes a first input terminal, a first output terminal, a first transistor, and a second circuit. The second circuit includes a second to a (2n+1)th transistor, a first to an n-th capacitor, a first wiring, a first to an n-th storage node (n is an integer of 2 or more). A gate of a 2i-th transistor is electrically connected to the first wiring (i is an integer of 1 to n), a first terminal of the 2i-th transistor is electrically connected to a gate of a (2i+1)th transistor and a first terminal of an i-th capacitor through an i-th storage node. The first input terminal is electrically connected to a first terminal of the third transistor. A second terminal of a (2i−1)th transistor is electrically connected to a first terminal of the (2i+1)th transistor. A second terminal of the (2n+1)th transistor is electrically connected to a first terminal of the first transistor. A second terminal of the first transistor is electrically connected to the first output terminal.

(3)

Another embodiment of the present invention is the semiconductor device according to (1) or (2), which includes a memory cell array and a plurality of first circuits. The memory cell array includes a plurality of second circuits.

(4)

Another embodiment of the present invention is the semiconductor device according to (3), which includes a plurality of memory cell arrays that overlap with each other.

(5)

Another embodiment of the present invention is the semiconductor device according to any one of (1) to (4), which includes a third circuit. The third circuit is configured to supply a potential to the first circuit and read a potential output from the first circuit. The first input terminal is electrically connected to the third circuit. The first output terminal is electrically connected to the third circuit.

(6)

Another embodiment of the present invention is the semiconductor device according to (5), in which the second circuit is over the third circuit.

(7)

Another embodiment of the present invention is the semiconductor device according to any one of (1) to (6), in which the first to the (2n+1)th transistor include an oxide semiconductor in a channel formation region.

(8)

Another embodiment of the present invention is the semiconductor device according to any one of (1) to (6), in which the first transistor includes silicon in a channel formation region and the second to the (2n+1)th transistor include an oxide semiconductor in a channel formation region.

(9)

Another embodiment of the present invention is the semiconductor device according to any one of (1) to (8), in which at least one of the first to the (2n+1)th transistor includes a back gate.

(10)

Another embodiment of the present invention is the semiconductor device according to any one of (1) to (9), in which the first to the n-th storage node are configured to retain M-bit data (M is an integer of 1 or more) as a potential and output, from the first output terminal, a potential corresponding to the potential maintained at the first to the n-th storage node.

According to one embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to another embodiment of the present invention, a novel semiconductor device, a novel memory device, a novel module, a novel electronic device, and the like can be provided.

According to another embodiment of the present invention, a semiconductor device with a large storage capacity can be provided. According to another embodiment of the present invention, a semiconductor device with a low power consumption can be provided. According to another embodiment of the present invention, a highly reliable semiconductor device can be provided.

Note that the effects of one embodiment of the present invention are not limited to the above effects. The effects described above do not disturb the existence of other effects. The other effects are ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF DRAWINGS

In the accompanying drawings:

FIG. 5 is a timing chart showing an operation example of a memory cell of one embodiment of the present invention;

FIGS. 21A to 21E show structural analysis of a CAAC-OS and a single crystal oxide semiconductor by XRD and selected-area electron diffraction patterns of a CAAC-OS;

BEST MODE FOR CARRYING OUT THE INVENTION

Figure 1:
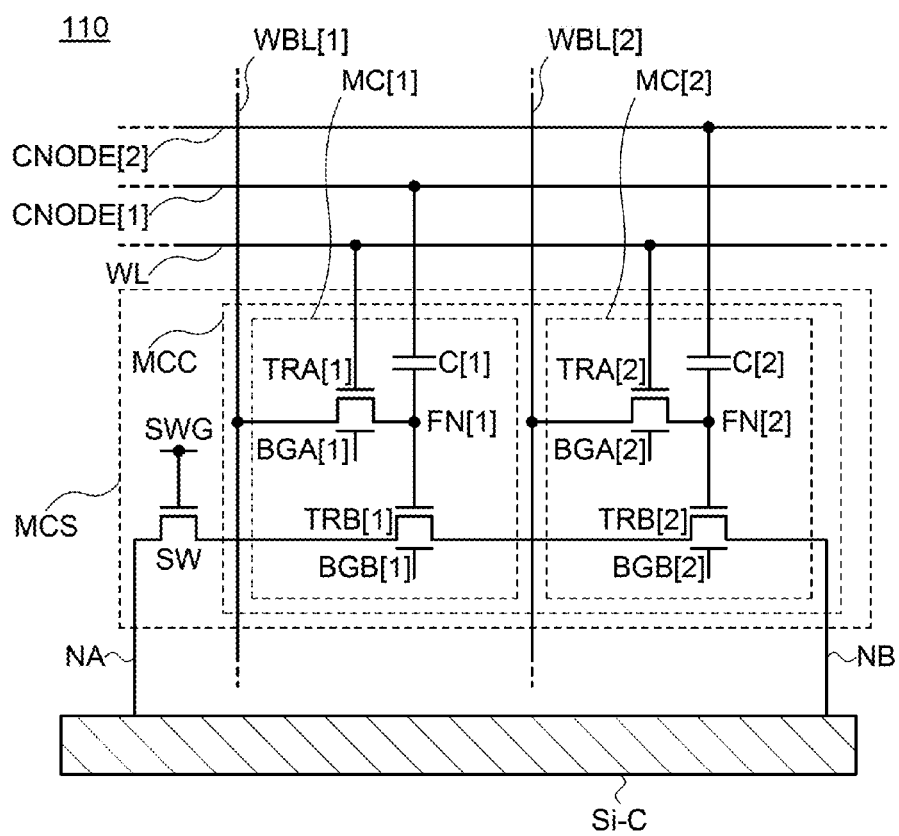
FIG. 1 is a circuit diagram of a semiconductor device of one embodiment of the present invention.

Embodiments of the present invention will be described in detail with reference to drawings. However, the present invention is not limited to the description below, and it is easily understood by those skilled in the art that modes and details disclosed herein can be modified in various ways. Furthermore, the present invention is not construed as being limited to the description of the embodiments. In describing structures of the invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams are exaggerated for clarity in some cases.

A voltage usually refers to a potential difference between a given potential and a reference potential (e.g., a ground potential (GND) or a source potential). A voltage can be referred to as a potential and vice versa.

In this specification, when a gate of an n-channel transistor (a p-channel transistor) has a high-level potential, the potential is high enough in a positive direction to bring a drain and a source of the n-channel transistor (the p-channel transistor) into conduction (out of conduction). In this specification, when a gate of an n-channel transistor (a p-channel transistor) has a low-level potential, the potential is high enough in a negative direction to bring a drain and a source of the n-channel transistor (the p-channel transistor) out of conduction (into conduction).

In this specification and the like, ordinal numbers such as "first", "second", and "third" are used in order to avoid confusion among components. Thus, the terms do not limit the number or order of components. For example, in the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals in some cases, and the description thereof is not repeated in some cases.

Note that a "semiconductor" has characteristics of an "insulator" in some cases when, for example, the conductivity is sufficiently low. Further, a "semiconductor" and an "insulator" cannot be strictly distinguished from each other in some cases because the border therebetween is not clear. Accordingly, a "semiconductor" in this specification can be called an "insulator" in some cases. Similarly, an "insulator" in this specification can be called a "semiconductor" in some cases.

Note that a "semiconductor" has characteristics of a "conductor" in some cases when, for example, the conductivity is sufficiently high. Further, a "semiconductor" and a "conductor" cannot be strictly distinguished from each other in some cases because the border therebetween is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, for example, the density of states (DOS) may be formed in a semiconductor, the carrier mobility may be decreased, or the crystallinity may be decreased. When the semiconductor is an oxide semiconductor, examples of an impurity that changes the characteristics of the semiconductor include Group 1 elements, Group 2 elements, Group 14 elements, Group 15 elements, and transition metals other than the main components, and specifically include, for example, hydrogen (also included in water), lithium, sodium, silicon, boron, phosphorus, carbon, and nitrogen. In particular, oxygen vacancies may be formed by entry of impurities such as hydrogen. When the semiconductor is silicon, examples of an impurity that changes the characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

In this specification and the like, in description of connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the electric field mobility, the current value per channel width, and the like of a transistor are obtained by calculation, a surrounded channel width is used for the calculation in some cases. In that case, the values might be different from those calculated by using an effective channel width.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

An example of a semiconductor device of one embodiment of the present invention will be described below.
<Memory Cell>

Described first is an example of a memory cell which is a basic configuration of the semiconductor device of one embodiment of the present invention.
<<Configuration Example of Memory Cell>>

Figure 2:
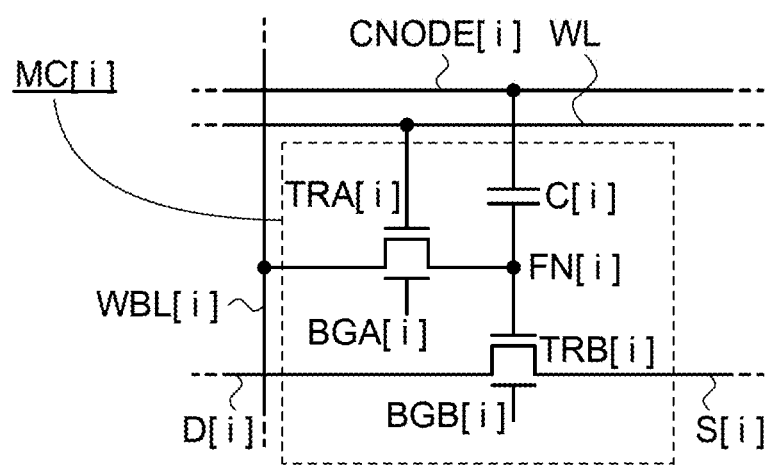
FIG. 2 is a circuit diagram of a memory cell of one embodiment of the present invention.

FIG. 2 illustrates a memory cell MC[i] (i is an integer of 1 or more). The memory cell MC[i] includes a transistor TRA[i], a transistor TRB[i], and a capacitor C[i] and is electrically connected to a wiring CNODE[i], a wiring WL, a wiring D[i], a wiring S[i], and a wiring WBL[i]. The transistor TRA[i] includes a back gate BGA[i], and the transistor TRB[i] includes a back gate BGB[i].

A gate of the transistor TRA[i] is electrically connected to the wiring WL; one of a source and a drain of the transistor TRA[i] is electrically connected to the wiring WBL[i]; the capacitor C[i] is connected between the other of the source and the drain of the transistor TRA[i] and the wiring CNODE[i]; a gate of the transistor TRB[i] is electrically connected to the other of the source and the drain of the transistor TRA[i]; one of a source and a drain of the transistor TRB[i] is electrically connected to the wiring D[i]; and the other of the source and the drain of the transistor TRB[i] is electrically connected to the wiring S[i].

Figure 6A:
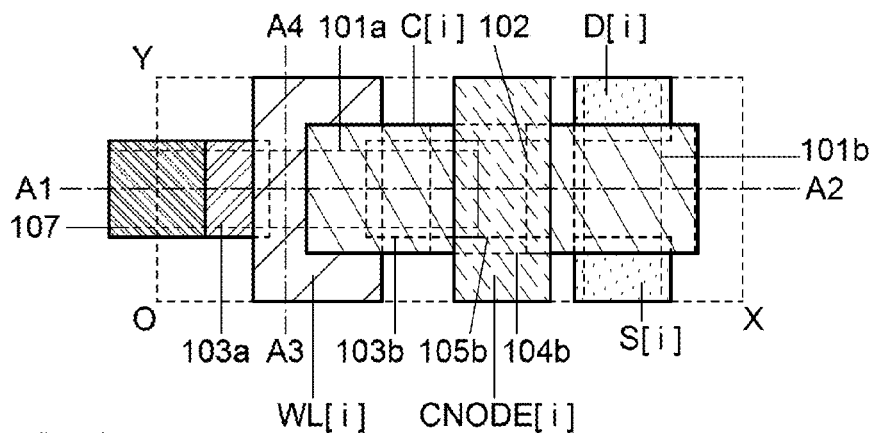
FIGS. 6A and 6B are a top view and a cross-sectional view of a memory cell of one embodiment of the present invention.

Next, a structure of the memory cell MC[i] will be described. FIG. 6A is a top view of part of the memory cell MC[i], and FIG. 6B is a cross-sectional view along dashed-dotted lines A1-A2 and A3-A4 in FIG. 6A.

Figure 6B:
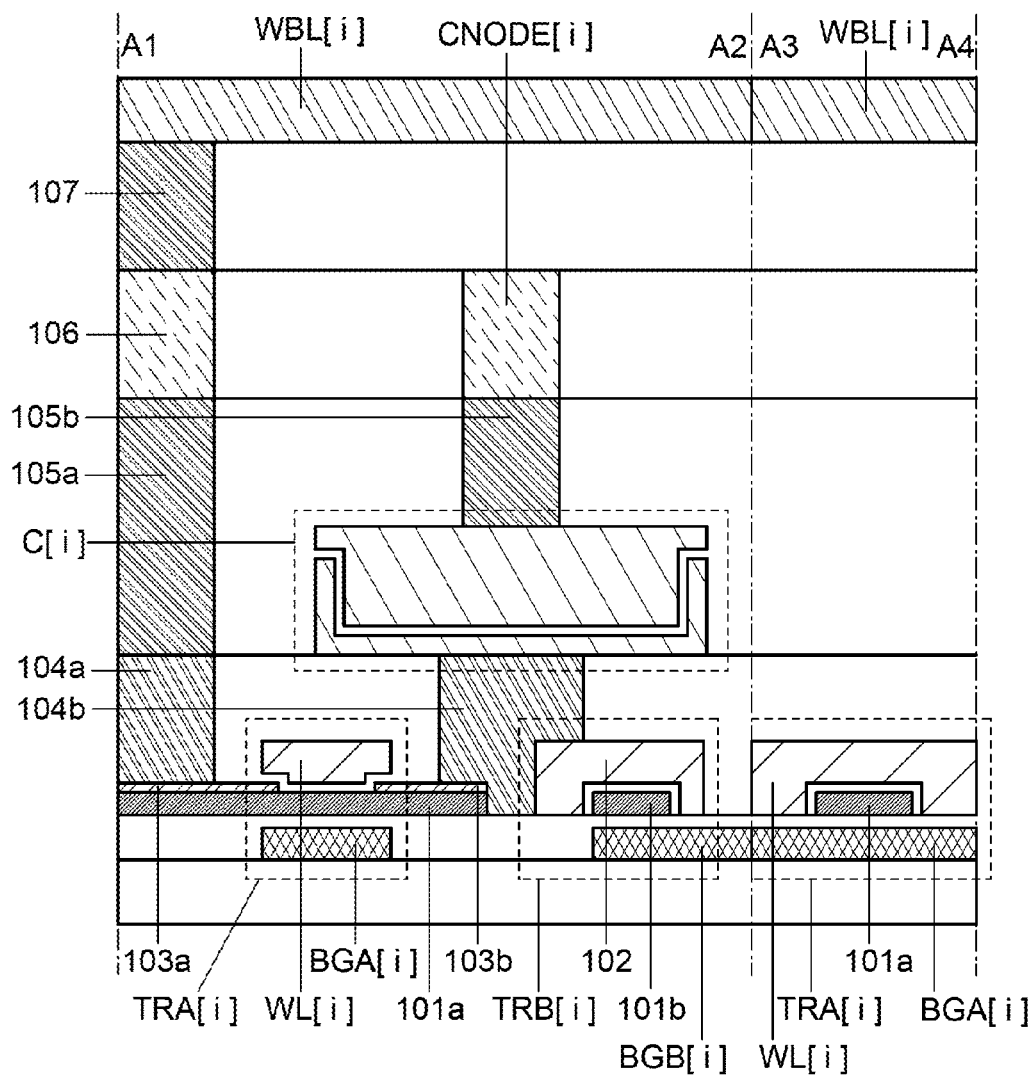

Note that in FIG. 6B, all regions that are not hatched and are not given reference numerals denoting a conductor, a semiconductor, an element, a circuit, and the like represent insulators.

The transistor TRA[i], the transistor TRB[i], and the wiring WL are provided in the same layer. Above the layer, the trench-shape capacitor C[i], the wiring CNODE[i], and the wiring WBL[i] are provided in this order.

The transistor TRA[i] includes the wiring WL[i], a semiconductor 101a, a conductor 103a, a conductor 103b, and the back gate BGA[i]. The transistor TRB[i] includes a conductor 102, a semiconductor 101b, the wiring S[i], wiring D[i], and the back gate BGB[i]. Note that the wiring S[i] and the wiring D[i] are not illustrated in FIG. 6B because they are not on dashed-dotted line A1-A2.

Above the conductor 103a, a conductor 104a, a conductor 105a, a conductor 106, and a conductor 107 are provided in order. The conductor 103a is electrically connected to the wiring WBL[i] through the conductors 104a, 105a, 106, and 107.

A conductor 104b is in contact with and electrically connected to the conductors 103b and 102. The trench-shape capacitor C[i] is provided above the conductor 104b, and the conductor 104b is electrically connected to one electrode of the capacitor C[i].

A conductor 105b is provided above the capacitor C[i], and the other electrode of the capacitor C[i] is electrically connected to the wiring CNODE[i] through the conductor 105b.

In particular, the semiconductors 101a and 101b are preferably oxide semiconductors containing at least one of indium, zinc, and gallium. A transistor using such an oxide semiconductor can have an extremely low off-state current.

According to an estimate using a 60-nm-technology, the number of memory cells MC[i] per unit area could be increased. That is, it is possible to reduce the area needed to increase one-bit storage capacity. For example, according to an estimate using the memory cell MC[i] in FIG. 6A, the length of OX is 0.365 μm and the length of OY is 0.14 μm; thus, the memory cell MC[i] has an area of 0.0511 μm². In the case where the memory cell MC[i] stores four bits, the area for each bit is 0.0127775 μm².

Note that the structure of the memory device (memory cell) of one embodiment of the present invention is not limited to that illustrated in FIGS. 6A and 6B. For example, in FIG. 6B, an upper electrode of the capacitor C[i] can be led to serve as the wiring CNODE[i]. In that case, the conductors 105b, 106, and 107 and the wiring CNODE[i] above the capacitor C[i] can be omitted, reducing the number of manufacturing processes of the memory device.

<<Memory Cell Operation Example>>

Next, writing and reading operations of the memory cell MC[i] will be described; here, 1-bit data is written to and read from each memory cell. The 1-bit data can handle two kinds of data "0" and "1" in a binary number. In the following description, in some cases, potentials indicating data "0" and "1" are represented by $V_0$ and $V_1$, respectively, and data "0" and "1" are collectively referred to as two levels.

Figure 3A:
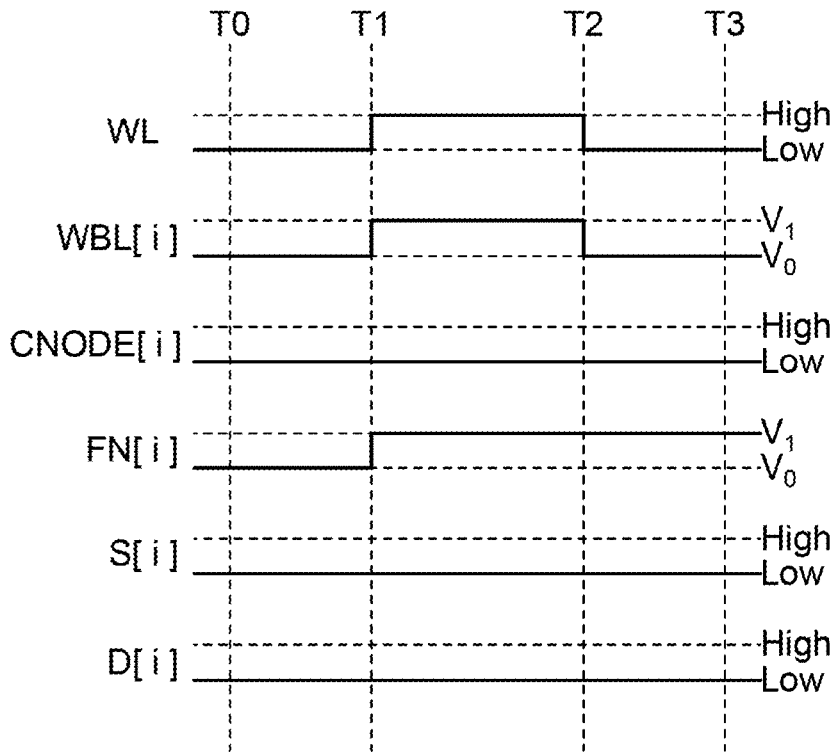
FIGS. 3A and 3B are timing charts showing an operation example of a memory cell of one embodiment of the present invention.

FIG. 3A is a timing chart showing an operation of writing $V_1$ to the memory cell MC[i]. From Time T0 to Time T1, the potentials of the wiring WL, the wiring CNODE[i], the node FN[i], the wiring S[i], and the wiring D[i] are Low (hereinafter also referred to as a low level or an L level), and the potentials of the wiring WBL[i] and the node FN[i] are $V_0$. In particular, the low-level potential supplied to the wiring CNODE[i] is preferably a reference potential.

At Time T1, the potential of the wiring WL is High (hereinafter also referred to as a high level or an H level). Then, the drain and source of the transistor TRA[i] are electrically connected, so that the potential of the wiring WBL[i] is supplied to the node FN[i]. That is, in the case where the wiring WBL[i] has the potential $V_1$ from Time T1 to Time T2, the node FN[i] also has the potential $V_1$. At this time, a potential difference occurs between the node FN[i] and the wiring CNODE[i], and the potential difference is maintained in the capacitor C[i].

At Time T2, the potential of the wiring WL is set at the low level, making no electrical conduction between the drain and source of the transistor TRA[i]. Even when the potential of the wiring WBL[i] is at the low level from Time T2 to Time T3, the potential of the node FN[i] can be maintained at $V_1$ by the capacitor C[i].

Figure 3B:
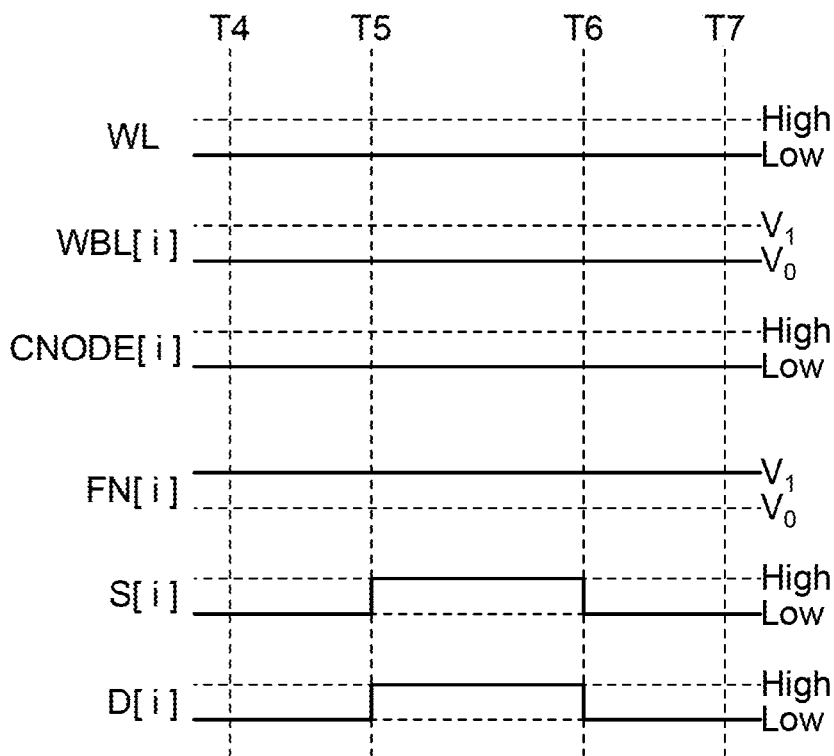

FIG. 3B is a timing chart showing an operation of reading $V_1$ from the memory cell MC[i]. Time T4 is after Time T3 in the timing chart of FIG. 3A. In other words, the potentials of the wiring WL, the wiring WBL[i], the wiring CNODE[i], the node FN[i], the wiring D[i], and the wiring S[i] at Time T4 are those after Time T3 in FIG. 3A.

From Time T5 to Time T6, a high-level potential is supplied to the wiring S[i]. At this time, the potential of the node FN[i] is $V_1$, so that the transistor TRB[i] is turned on and a high-level potential is supplied to the wiring D[i]. Thus, the potential ($V_1$) of the node FN[i] can be read when the wiring D[i] of the memory cell MC[i] is electrically connected to a reading circuit.

When the reading operation is completed, a low-level potential is supplied to the wiring S[i] at Time T6. Since the potential of the node FN[i] is $V_1$, the transistor TRB[i] is turned on and a low-level potential is supplied to the wiring D[i] from Time T6 to Time T7. Note that at this time, the reading circuit electrically connected to the wiring D[i] of the memory cell MC[i] does not operate.

Figure 4A:
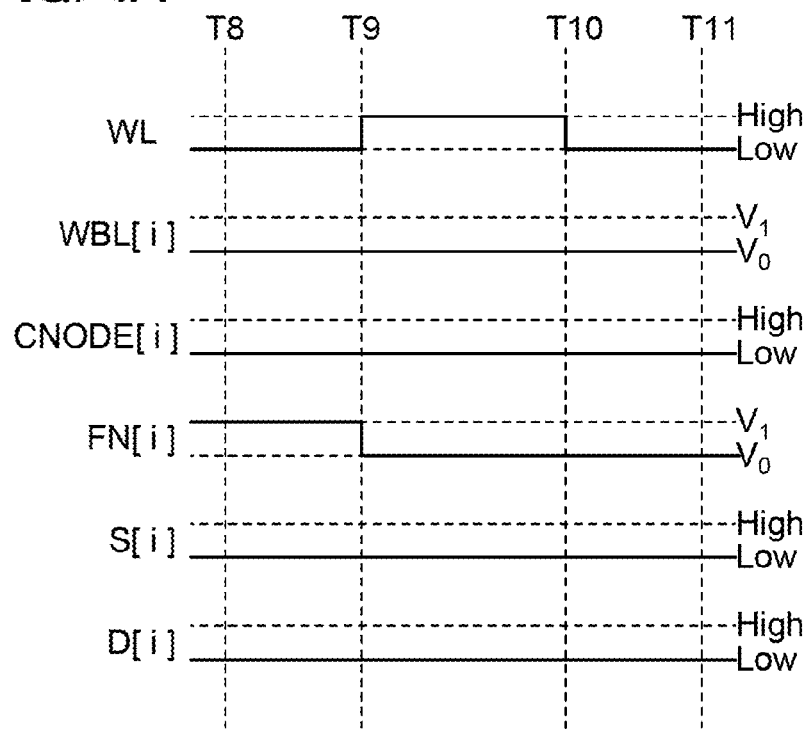
FIGS. 4A and 4B are timing charts showing an operation example of a memory cell of one embodiment of the present invention.

FIG. 4A is a timing chart showing an operation of writing $V_0$ to the memory cell MC[i]. Time T8 is after Time T7 in the timing chart of FIG. 3B. In other words, the potentials of the wiring WL, the wiring WBL[i], the wiring CNODE[i], the node FN[i], the wiring D[i], and the wiring S[i] at Time T8 are those after Time T7 in FIG. 3B.

At Time T9, the potential of the wiring WL is set at the high level. Then, the drain and source of the transistor TRA[i] are electrically connected, so that the potential of the wiring WBL[i] is supplied to the node FN[i]. That is, in the case where the wiring WBL[i] has the potential $V_0$ from Time T9 to Time T10, the node FN[i] also has the potential $V_0$. At this time, a potential difference occurs between the node FN[i] and the wiring CNODE[i], and the potential difference is maintained in the capacitor C[i].

At Time T10, the potential of the wiring WL is set at the low level, making no electrical conduction between the drain and source of the transistor TRA[i]. Even when the potential of the wiring WBL[i] is at the low level from Time T10 to Time T11, the potential of the node FN[i] can be maintained at $V_0$ by the capacitor C[i].

Figure 4B:
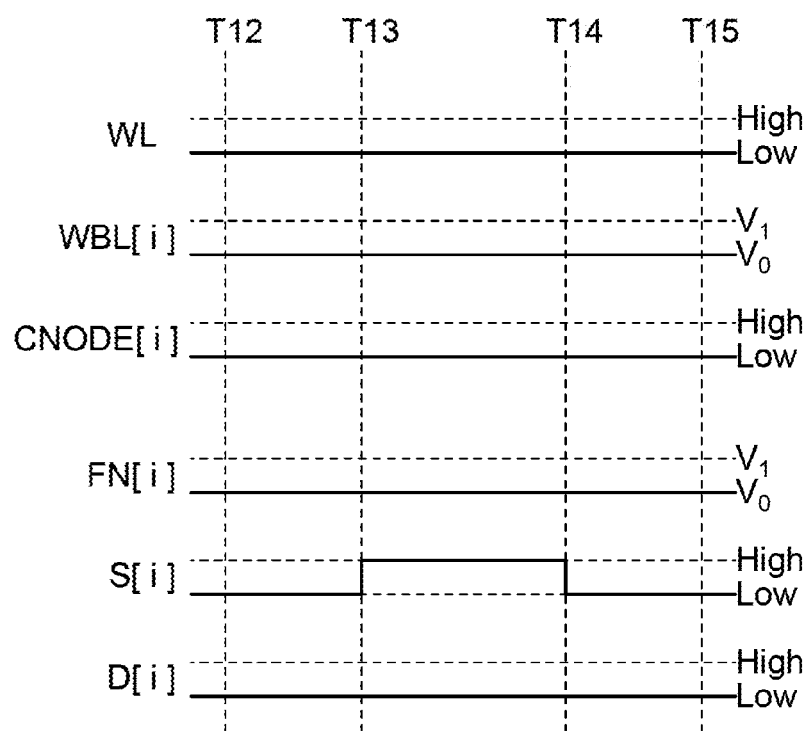

FIG. 4B is a timing chart showing an operation of reading $V_0$ from the memory cell MC[i]. Time T12 is after Time T11 in the timing chart of FIG. 4A. In other words, the potentials of the wiring WL, the wiring WBL[i], the wiring CNODE[i], the node FN[i], the wiring D[i], and the wiring S[i] at Time T12 are those after Time T11 in FIG. 4A.

From Time T13 to Time T14, a high-level potential is supplied to the wiring S[i]. At this time, the potential of the node FN[i] is $V_0$, so that the transistor TRB[i] is turned off and a high-level potential is not supplied to the wiring D[i] from the wiring S[i]. Thus, the potential ($V_0$) of the node FN[i] can be read when the wiring D[i] of the memory cell MC[i] is electrically connected to a reading circuit.

When the reading operation is completed, a low-level potential is supplied to the wiring S[i] at Time T14. Since the potential of the node FN[i] is $V_0$, the transistor TRB[i] is off and the potential of the wiring D[i] is maintained at the low level. Note that at this time, the reading circuit electrically connected to the wiring D[i] of the memory cell MC[i] does not operate.

FIG. 5 shows a timing chart in the case where a high-level potential is supplied to the wiring CNODE[i] of the memory cell MC[i]. From Time T16 to Time T17, the potentials of the wiring WL, the wiring CNODE[i], the wiring S[i], and the wiring D[i] are at the low level, the wiring WBL[i] has the potential $V_0$, and either the potential $V_0$ or $V_1$ is maintained at the node FN[i].

From Time T17 to Time T18, a high-level potential is supplied to the wiring CNODE[i]. At this time, the transistor TRA[i] is off, and the potential of the node FN[i] increases in accordance with the high-level potential supplied to the wiring CNODE[i] because the capacitor C[i] maintains charges. For example, when a high-level potential is supplied to the wiring CNODE[i] while the potential $V_0$ is maintained at the node FN[i], the node FN[i] has a potential of ($V_0$+a potential corresponding to a coupling ratio). Hence, when a high-level potential is supplied to the wiring CNODE[i] while the potential $V_1$ is maintained at the node FN[i], the node FN[i] has a potential of ($V_1$+a potential corresponding to a coupling ratio). That is, the transistor TRB[i] is turned on regardless of whether the potential $V_0$ or $V_1$ is maintained at the node FN[i].

When a high-level potential is supplied to the wiring S[i] from Time T17 to Time T18, a high-level potential can be supplied to the wiring D[i] because the transistor TRB[i] is on.

The memory cell of one embodiment of the present invention is not limited to be used alone but two or more memory cells may be connected in series. In that case, a memory cell to be read is selected by adjusting the potential of the wiring CNODE[i], a potential is supplied to the wiring S[i], and then a potential is read from the wiring D[i]. A configuration including two or more memory cells connected in series will be described later.

In addition, the memory cell of one embodiment of the present invention is not limited to two levels. Two or more levels such as four levels (two bits) or eight levels (three bits) can be selected in accordance with the configuration of the memory cell.

Note that by using an oxide semiconductor containing at least one of indium, zinc, and gallium for a channel formation region of the transistor TRA[i], the off-state current of the transistor TRA[i] can be reduced in some cases, allowing the potential of the node FN[i] to be maintained for a long time. Hereinafter, a transistor including the oxide semiconductor is also referred to as an oxide semiconductor (OS) transistor.

It is supposed that 1-bit data is retained in the node FN[i] for 10 years. In the case where the power source voltage is higher than or equal to 2 V and lower than or equal to 3.5 V, the storage capacitance of the node FN[i] is 21 fF, and the acceptable amount of change in stored potential is less than 0.5 V, the leakage current of the node FN[i] needs to be lower than $33 \times 10^{-24}$ A in order that a change in stored potential is less than the acceptable range for 10 years. In the case where the leakage current of other components is lower than the above and a leakage current occurs almost exclusively in OS transistors, each OS transistor with a channel width of 350 nm preferably has a leakage current per unit area of lower than $93 \times 10^{-24}$ A/μm. In the memory cell MC[i] having the above configuration, data can be retained at 85° C. for 10 years.

It is supposed that 4-bit data is retained in the node FN[i]. In the case where the power source voltage is higher than or equal to 2 V and lower than or equal to 3.5 V, the storage capacitance is 0.1 fF, the distribution width of a stored potential is less than 30 mV, and the acceptable amount of change in stored potential is less than 80 mV, the leakage current of the node FN[i] needs to be lower than $0.025 \times 10^{-24}$ A in order that a change in stored potential is less than the acceptable range for 10 years. In the case where the leakage current of other components is lower than the above and a leakage current occurs almost exclusively in OS transistors, each OS transistor with a channel width of 60 nm preferably has a leakage current per unit area of lower than $0.423 \times 10^{-24}$ A/μm. In the memory cell MC[i] having the above configuration, data can be retained at 85° C. for 10 years.

It is supposed that 8-bit data is retained in the node FN[i]. In the case where the power source voltage is higher than or equal to 2 V and lower than or equal to 3.5 V, the storage capacitance is 0.1 fF, the distribution width of a stored potential is less than 2 mV, and the acceptable amount of change in stored potential is less than 5 mV, the leakage current of the node FN[i] needs to be lower than $0.0016 \times 10^{-24}$ A in order that a change in stored potential is less than the acceptable range for 10 years. In the case where the leakage current of other components is lower than the above and a leakage current occurs almost exclusively in OS transistors, each OS transistor with a channel width of 60 nm preferably has a leakage current per unit area of lower than $0.026 \times 10^{-24}$ A/μm. In the memory cell MC[i] having the above configuration, data can be retained at 85° C. for 10 years.

Note that the memory cell of one embodiment of the present invention is not limited to the aforementioned memory cell MC[i]. Depending on the circumstances or case, a variety of semiconductors may be used for the channel formation regions, the source and drain regions, and the like of the transistors included in the memory cell MC[i], and the structures of the transistors may also be changed.

Figure 7:
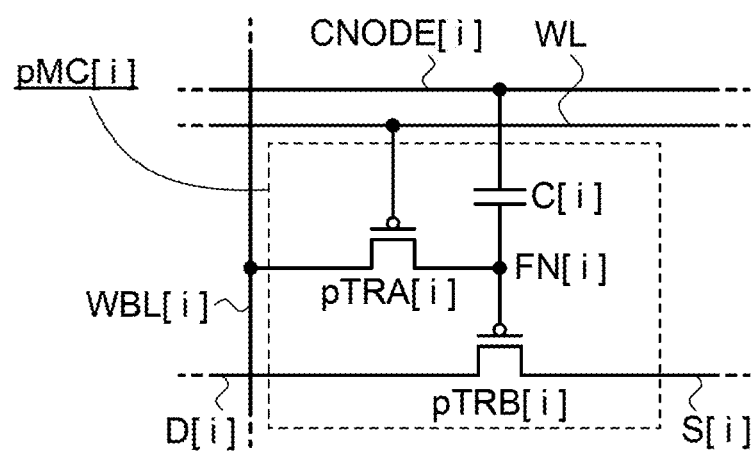
FIG. 7 is a circuit diagram of a memory cell of one embodiment of the present invention.

For example, as in a memory cell pMC[i] illustrated in FIG. 7, the n-channel transistors TRA[i] and TRB[i] in the memory cell MC[i] may be changed into p-channel transistors pTRA[i] and pTRB[i]. Alternatively, not all the n-channel transistors but some n-channel transistors may be changed into p-channel transistors.

<Semiconductor Device>

A semiconductor device of one embodiment of the present invention will be described below.

<<Configuration Example of Semiconductor Device>>

FIG. 1 illustrates an example of the semiconductor device in which the two memory cells MC[i] described in <<Configuration Example of Memory Cell>> are provided in the same layer. A semiconductor device 110 includes a circuit unit MCS and a circuit unit Si—C. The circuit unit MCS includes a transistor SW and a circuit unit MCC. The circuit unit MCC includes a memory cell MC[1] and a memory cell MC[2]. The memory cell MC[1] and the memory cell MC[2] have the same configuration as the memory cell MC[i] in FIG. 2. The memory cell MC[1] is electrically connected to a wiring CNODE[1], the wiring WL, and a wiring WBL[1] and is also electrically connected to a node NA through the transistor SW. The memory cell MC[2] is electrically connected to a wiring CNODE[2], the wiring WL, a wiring WBL[2], and a node NB. The circuit unit Si—C includes an output terminal and an input terminal. The output terminal is electrically connected to the node NA and the input terminal is electrically connected to the node NB.

The memory cell MC[1] includes a transistor TRA[1], a transistor TRB[1], and a capacitor C[1]. The transistor TRA[1] includes a back gate BGA[1] and the transistor TRB[1] includes a back gate BGB[1]. The memory cell MC[2] includes a transistor TRA[2], a transistor TRB[2], and a capacitor C[2]. The transistor TRA[2] includes a back gate BGA[2] and the transistor TRB[2] includes a back gate BGB[2].

A gate of the transistor TRA[1] is electrically connected to the wiring WL; one of a source and a drain of the transistor TRA[1] is electrically connected to the wiring WBL[1]; the capacitor C[1] is connected between the other of the source and the drain of the transistor TRA[1] and the wiring CNODE[1]; a gate of the transistor TRB[1] is electrically connected to the other of the source and the drain of the transistor TRA[1]; one of a source and a drain of the transistor TRB[1] is electrically connected to one of a source and a drain of the transistor SW.

A gate of the transistor TRA[2] is electrically connected to the wiring WL; one of a source and a drain of the transistor TRA[2] is electrically connected to the wiring WBL[2]; the capacitor C[2] is connected between the other of the source and the drain of the transistor TRA[2] and the wiring CNODE[2]; a gate of the transistor TRB[2] is electrically connected to the other of the source and the drain of the transistor TRA[2]; one of a source and a drain of the transistor TRB[2] is electrically connected to the other of the source and the drain of the transistor TRB[1] in the memory cell MC[1].

The other of the source and the drain of the transistor SW is electrically connected to the node NA; the other of the source and the drain of the transistor TRB[2] is electrically connected to the node NB; and a gate of the transistor SW is electrically connected to a wiring SWG.

Figure 10:
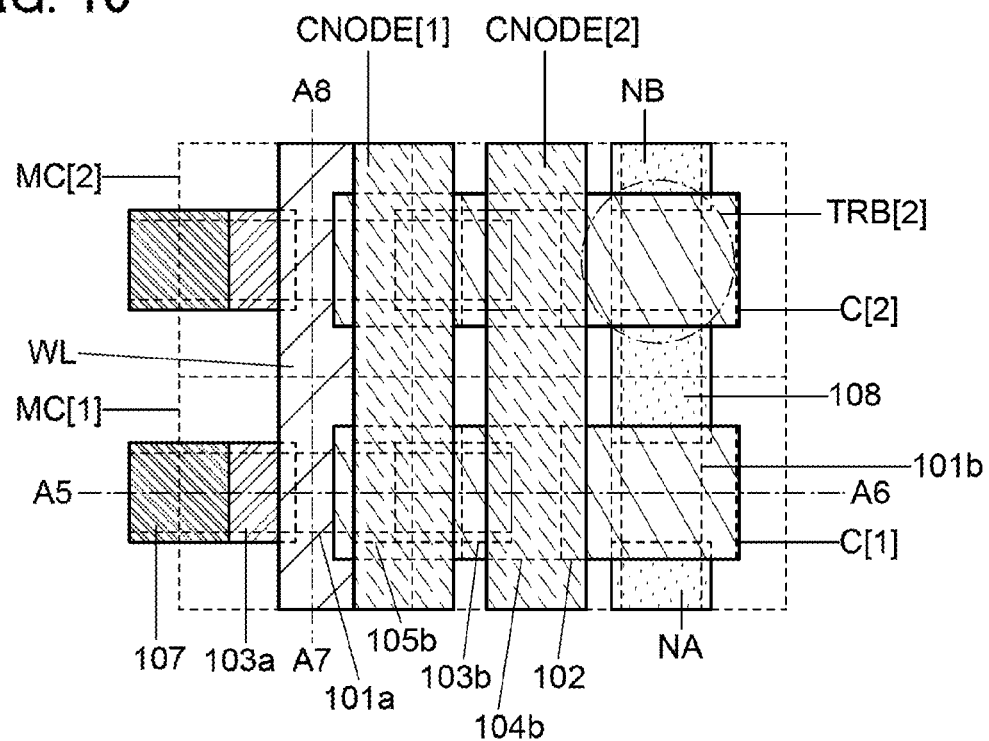
FIG. 10 is a top view of a semiconductor device of one embodiment of the present invention.

Next, a structure of the semiconductor device 110 will be described. FIG. 10 is a top view of part of the semiconductor device 110, and FIG. 11 is a cross-sectional view along dashed-dotted lines A5-A6 and A7-A8 in FIG. 10.

Figure 11:
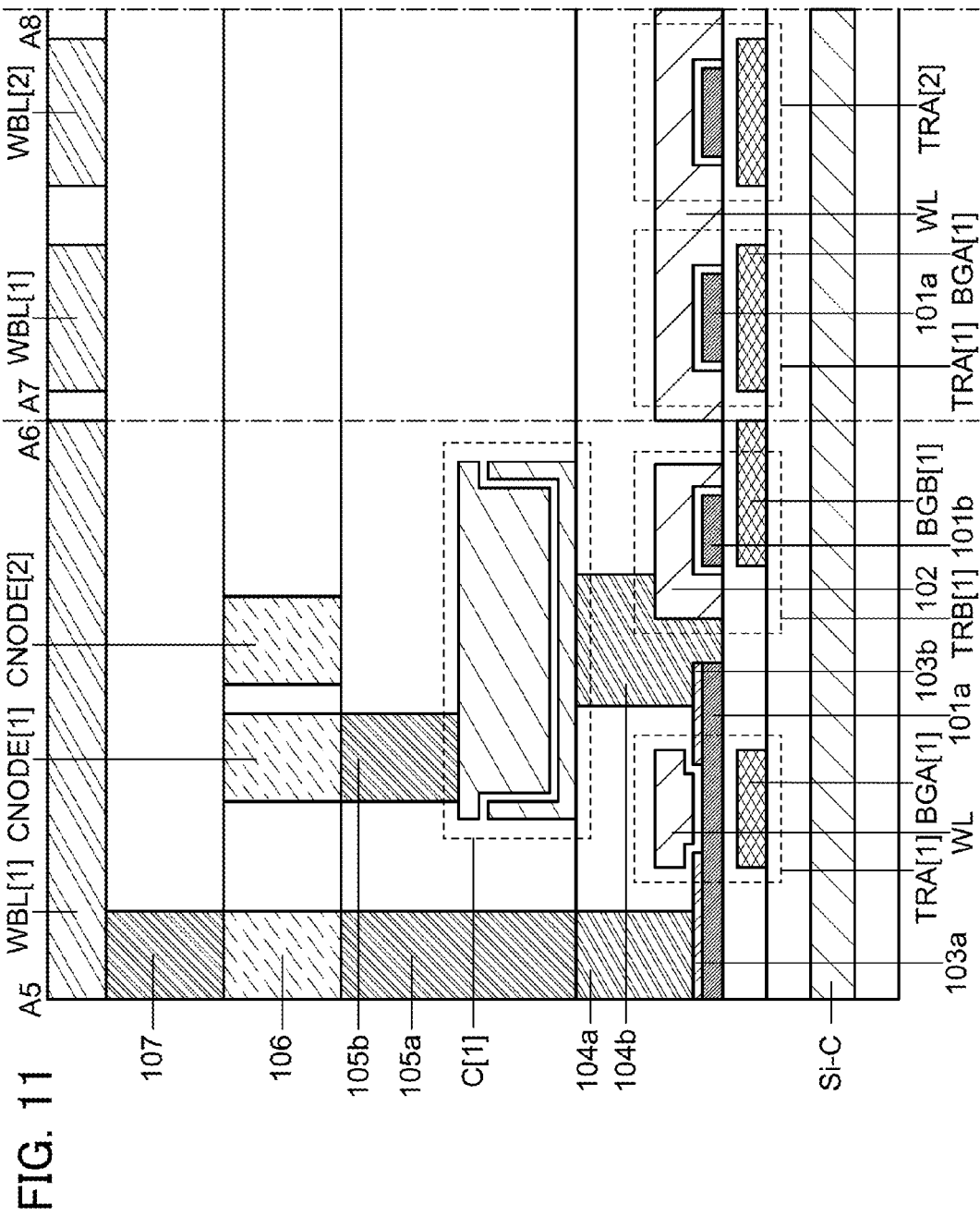
FIG. 11 is a cross-sectional view of a semiconductor device of one embodiment of the present invention.

Note that in FIG. 11, all regions that are not hatched and are not given reference numerals denoting a conductor, a semiconductor, an element, a circuit, and the like represent insulators.

Note that the region of the circuit unit Si—C in FIG. 11 is not a cross-sectional view, but illustrates that the circuit unit Si—C is provided under the layer including the transistors TRA[1], TRB[1], TRA[2], and TRB[2] (not illustrated in FIG. 11) with an insulating film interposed therebetween.

Note that the transistor SW is not illustrated in FIG. 11.

The transistors TRA[1], TRB[1], TRA[2], and TRB[2], and the wiring WL are provided in the same layer. Above the layer, the trench-shape capacitors C[1] and C[2], the wirings CNODE[1] and CNODE[2], and the wirings WBL[1] and WBL[2] are provided in this order.

The transistor TRA[1] includes the wiring WL, the semiconductor 101a, the conductor 103a, the conductor 103b, and the back gate BGA[1]. The transistor TRB[1] includes the conductor 102, the semiconductor 101b, and the back gate BGB[1]. The transistor TRA[2] includes the wiring WL, the semiconductor 101a, the conductor 103a, the conductor 103b, and the back gate BGA[2]. The transistor TRB[2] includes the conductor 102, the semiconductor 101b, and the back gate BGB[2]. The other of the source and the drain of the transistor TRB[1] is electrically connected to one of the source and the drain of the transistor TRB[2] through a conductor 108.

In the memory cell MC[1], above the conductor 103a, the conductor 104a, the conductor 105a, the conductor 106, and the conductor 107 are provided in order. The conductor 103a is electrically connected to the wiring WBL[1] through the conductors 104a, 105a, 106, and 107. That is, one of the source and the drain of the transistor TRA[1] is connected to the wiring WBL[1] through the conductors of the respective layers.

In the memory cell MC[1], the conductor 104b is in contact with and electrically connected to the conductors 103b and 102. The trench-shape capacitor C[1] is provided above the conductor 104b, and the conductor 104b is electrically connected to one electrode of the capacitor C[1]. The conductor 105b is provided above the capacitor C[1], and the other electrode of the capacitor C[1] is electrically connected to the wiring CNODE[1] through the conductor 105b. That is, the wiring CNODE[1] is electrically connected to the other of the source and the drain of the transistor TRA[1] and the gate of the transistor TRB[1] through the capacitor C[1] and the conductors of the respective layers.

Unlike the memory cell MC[1], the memory cell MC[2] is not clearly illustrated in the cross-sectional view, but the memory cell MC[2] has a structure similar to that of the memory cell MC[1]. For example, the transistor TRA[2] is electrically connected to the wiring WBL[2] through the conductors of the respective layers as in the memory cell MC[1]. The wiring CNODE[2] is electrically connected to the other of the source and the drain of the transistor TRA[2] and the gate of the transistor TRB[2] through the capacitor C[2] and the conductors of the respective layers. Note that the wiring CNODE[1] and the wiring CNODE[2] are provided so as not to overlap with each other in the wiring layout. That is, the conductor 105b electrically connecting the wiring CNODE[1] to the capacitor C[1] in the memory cell MC[1] is shifted from the conductor between the wiring CNODE[2] and the capacitor C[2] in the A5 direction of dashed-dotted line A5-A6 in FIG. 11. Alternatively, the conductor 105b may be shifted in the A6 direction of dashed-dotted line A5-A6 in FIG. 11 as long as the wiring CNODE[1] and the wiring CNODE[2] do not overlap with each other.

Note that the semiconductor device 110 illustrated in FIGS. 1, 10, and 11 includes the transistors TRA[1], TRA[2], TRB[1], and TRB[2] each provided with a back gate; however, one embodiment of the present invention is not limited thereto. In the semiconductor device 110, all of the transistors TRA[1], TRA[2], TRB[1], and TRB[2] do not need to have a back gate, or some of the transistors may have a back gate depending on the need or circumstances.

<<Operation Example of Semiconductor Device>>

Next, writing and reading operations of the semiconductor device 110 will be described; here, 2-bit data is written to and read from each memory cell. The 2-bit data can handle four kinds of data "00" to "11" in a binary number. In the following description, in some cases, potentials indicating data "00", "01", "10", and "11" are represented by $V_{00}$, $V_{01}$, $V_{10}$, and $V_{11}$, respectively, and data "00" to "11" are collectively referred to as four levels.

Figure 8:
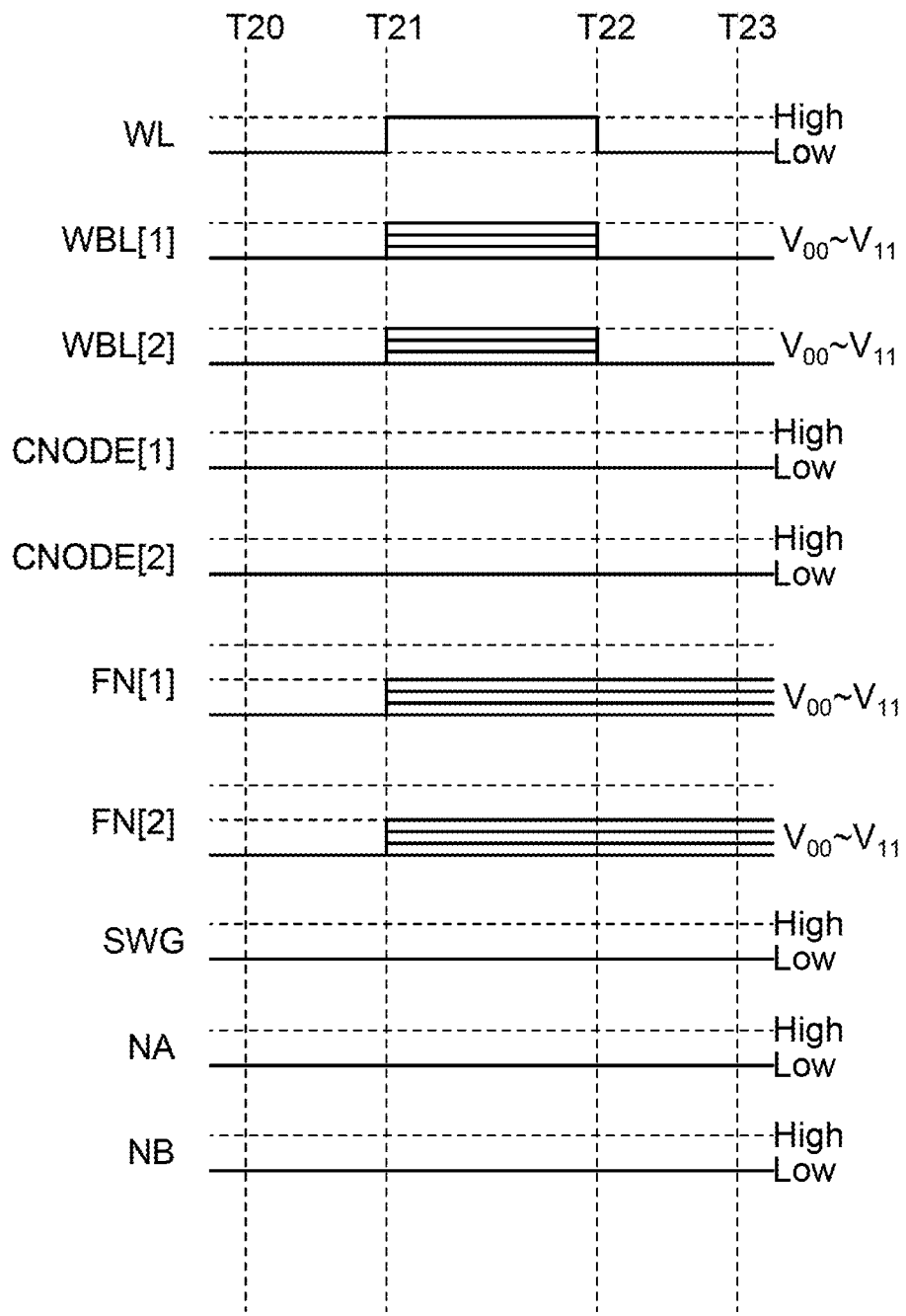
FIG. 8 is a timing chart showing an operation example of a semiconductor device of one embodiment of the present invention.

FIG. 8 is a timing chart showing a writing operation in the semiconductor device 110. From Time T20 to Time T21, the potentials of the wiring WL, the wiring WBL[1], the wiring WBL[2], the wiring CNODE[1], the wiring CNODE[2], the node FN[1], the node FN[2], the wiring SWG, the node NA, and the node NB are Low (hereinafter also referred to as a low level or an L level). In particular, the low-level potentials supplied to the wirings CNODE[1] and CNODE[2] are each preferably a reference potential.

At Time T21, the potential of the wiring WL is High (hereinafter also referred to as a high level or an H level). Then, the drain and source of the transistor TRA[1] are electrically connected, so that the potential of the wiring WBL[1] is supplied to the node FN[1]. At this time, any of the potentials $V_{00}$ to $V_{11}$ is supplied to the wiring WBL[1], and the node FN[1] has the same potential, which is maintained by the capacitor C[1].

At T21, the drain and source of the transistor TRA[2] are also electrically connected when the potential of the wiring WL is High, so that the potential of the wiring WBL[2] is supplied to the node FN[2]. In other words, when any of the potentials $V_{00}$ to $V_{11}$ is supplied to the wiring WBL[2] from Time T21 to Time T22, the node FN[2] has the same potential, which is maintained by the capacitor C[2].

In that case, the threshold voltage of the transistor TRB[1] is affected by the potential (any of the potentials $V_{00}$ to $V_{11}$) of the node FN[1] to be shifted in the negative direction effectively. The threshold voltage effectively shifted in the negative direction is determined by the potential of the node FN[1], and increases with the potential of the node FN[1] in the order of $V_{00}$, $V_{01}$, $V_{10}$, and $V_{11}$. When the reference potential is $V_{00}$, the threshold voltage is not effectively shifted in the negative direction. In the timing chart of FIG. 8, the reference potential is $V_{00}$. Therefore, the threshold voltage is not effectively shifted in the negative direction when the potential of the node FN[1] is $V_{00}$.

In addition, the effective negative shift in threshold voltage, which occurs when the potential of the node FN[1] is $V_{01}$, $V_{10}$, or $V_{11}$, determines the drain-source current and voltage of the transistor TRB[1]. For example, when the potential difference between the wiring CNODE[1] and one of the source and the drain of the transistor TRB[1] is $V_{TRB1W}$, the drain-source current and voltage of the transistor TRB[1] at $V_{TRB1W}$ of 0 V increase with the potential of the node FN[1] in the order of $V_{01}$, $V_{10}$, and $V_{11}$.

On the basis of the same principle as the transistor TRB[1] and the node FN[1], the threshold voltage of the transistor TRB[2] is also affected by the node FN[2] to be shifted in the negative direction effectively. The threshold voltage effectively shifted in the negative direction is determined by the potential of the node FN[2], and increases with the potential of the node FN[2] in the order of $V_{00}$, $V_{01}$, $V_{10}$, and $V_{11}$. When the reference potential is $V_{00}$, the threshold voltage is not effectively shifted in the negative direction. In the timing chart of FIG. 8, the reference potential is $V_{00}$. Therefore, the threshold voltage is not effectively shifted in the negative direction when the potential of the node FN[2] is $V_{00}$.

In addition, the effective negative shift in threshold voltage, which occurs when the potential of the node FN[2] is $V_{01}$, $V_{10}$, or $V_{11}$, determines the drain-source current and voltage of the transistor TRB[2]. For example, when the potential difference between the wiring CNODE[2] and one of the source and the drain of the transistor TRB[2] is $V_{TRB2W}$, the drain-source current and voltage of the transistor TRB[2] at $V_{TRB2W}$ of 0 V increase with the potential of the node FN[2] in the order of $V_{01}$, $V_{10}$, and $V_{11}$.

At Time T22, the potential of the wiring WL is set at the low level, making no electrical conduction between the drain and source of each of the transistors TRA[1] and TRA[2]. Even when the potentials of the wirings WBL[1] and WBL[2] are at the low level from Time T22 to Time T23, the potential of the node FN[1] can be maintained at any value of $V_{00}$ to $V_{11}$ by the capacitor C[1], and the potential of the node FN[2] can be maintained at any value of $V_{00}$ to $V_{11}$ by the capacitor C[2].

In particular, an oxide semiconductor containing at least one of indium, zinc, and gallium is preferably used for channel formation regions of the transistors TRA[1] and TRA[2]. The off-state currents of the transistors TRA[1] and TRA[2] including the oxide semiconductor can be reduced in some cases, allowing the potentials of the nodes FN[1] and [2] to be maintained for a long time.

Figure 9:
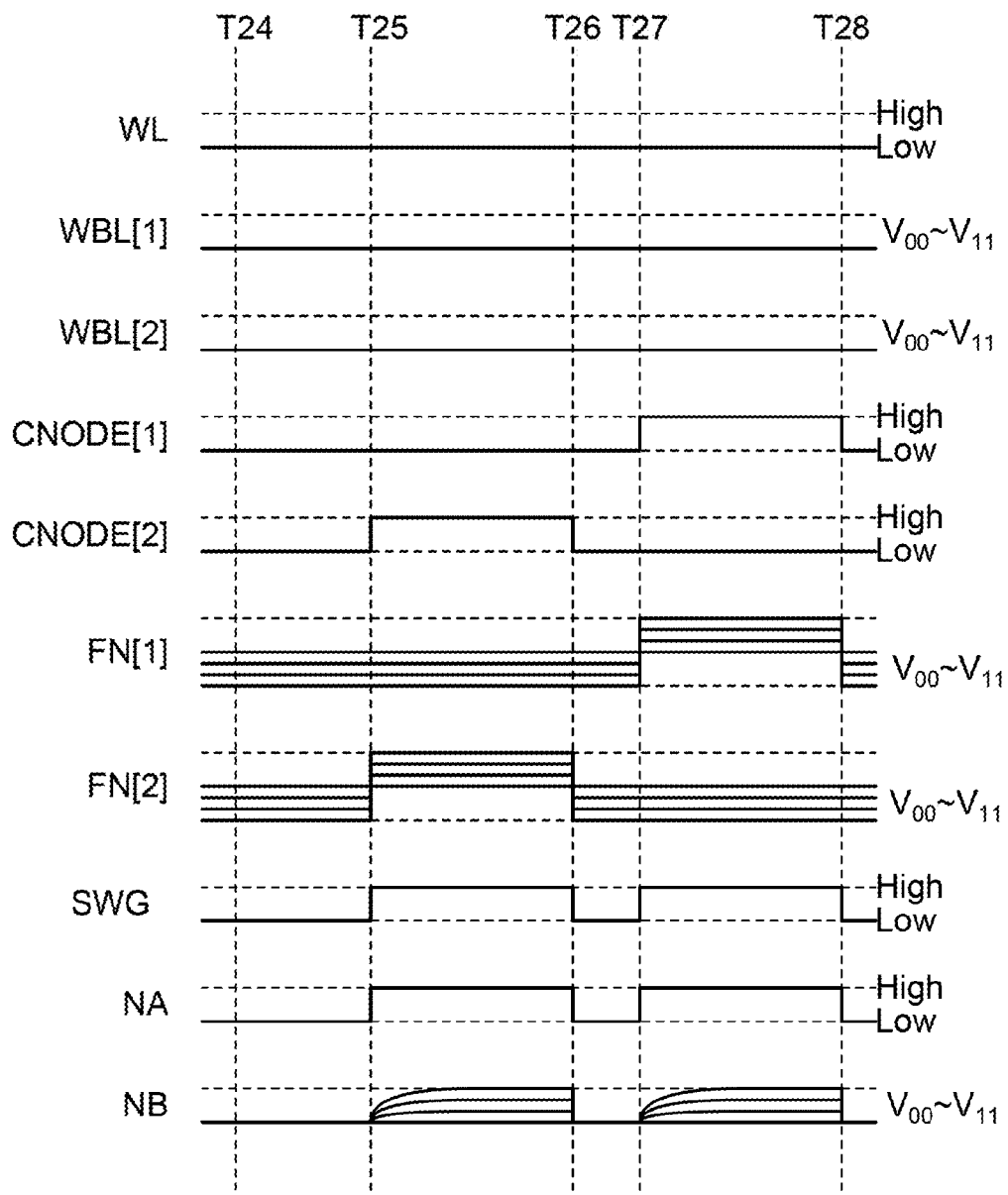
FIG. 9 is a timing chart showing an operation example of a semiconductor device of one embodiment of the present invention.

FIG. 9 is a timing chart showing a reading operation of the semiconductor device 110. Time T24 is after Time T23 in the timing chart of FIG. 8. In other words, the potentials of the wiring WL, the wiring WBL[1], the wiring WBL[2], the wiring CNODE[1], the wiring CNODE[2], the node FN[1], the node FN[2], the wiring SWG, the node NA, and the node NB at Time T24 are those after Time T23 in FIG. 8.

From Time T25 to Time T26, the potential of the wiring SWG is set at the high level, so that the transistor SW is turned on. In addition, the potential of the node NA is at the high level, whereby a high-level potential is supplied to one of the source and the drain of the transistor TRB[1] through the transistor SW.

Since the wiring CNODE[1] has a low-level potential, the drain-source current and voltage of the transistor TRB[1] at $V_{TRB1W}$ of 0 V are determined by the potential of the node FN[1]. That is, the voltage applied from the node NA to one of the source and the drain of the transistor TRB[1] is lowered to a voltage corresponding to the potential of the node FN[1] through the transistor TRB[1] and then is output to the other of the source and the drain of the transistor TRB[1]. Note that the voltage drop between the drain and the source of the transistor TRB[1] does not occur when the potential of the node FN[1] is $V_{11}$ because $V_{11}$ is at the high level.

When the potential of the wiring CNODE[2] is at the high level, the potential of the node FN[2] is increased by a potential corresponding to a coupling ratio because the capacitor C[2] intends to maintain the potential difference between the wiring CNODE[2] and the node FN[2].

At that time, $V_{TRB2W}$ has a potential capable of making the transistor TRB[2] on. Accordingly, the voltage input to one of the source and the drain of the transistor TRB[2] is output to the other of the source and the drain of the transistor TRB[2], i.e., the node NB without any change. In other words, the voltage lowered by the transistor TRB[1] in accordance with the potential of the capacitor C[1] is applied from the other of the source and the drain of the transistor TRB[1] to the node NB.

From Time T26 to Time T27, the potentials of the wiring CNODE[2], the wiring SWG, and the node NA are set at the low level.

From Time T27 to Time T28, the potential of the wiring SWG is set at the high level, so that the transistor SW is turned on. In addition, the potential of the node NA is set at the high level, whereby a high-level potential is supplied to one of the source and the drain of the transistor TRB[1] through the transistor SW.

When the potential of the wiring CNODE[1] is at the high level, the potential of the node FN[1] is increased by a potential corresponding to a coupling ratio because the capacitor C[1] intends to maintain the potential difference between the wiring CNODE[1] and the node FN[1].

At that time, $V_{TRB1W}$ has a potential capable of making the transistor TRB[1] on. Accordingly, the voltage input to one of the source and the drain of the transistor TRB[1] is output to the other of the source and the drain of the transistor TRB[1] without any change. In other words, the voltage from the node NA is input to one of the source and the drain of the transistor TRB[2].

Since the wiring CNODE[2] has a low-level potential, the drain-source current and voltage of the transistor TRB[2] at $V_{TRB2W}$ of 0 V are determined by the potential of the node FN[2]. That is, the voltage applied from the node NA to one of the source and the drain of the transistor TRB[2] is lowered to a voltage corresponding to the potential of the node FN[2] through the transistor TRB[2] and then is applied to the other of the source and the drain of the transistor TRB[1], i.e., the node NB. Note that the voltage drop between the drain and the source of the transistor TRB[2] does not occur when the potential of the node FN[2] is $V_{11}$ because $V_{11}$ is at the high level.

As described above, a high-level potential is input from the node NA to the memory cells MC[1] and MC[2] and the potentials of the wirings CNODE[1] and CNODE[2] are switched, so that either of a potential lowered between the source and the drain of the transistor TRB[1] or a potential lowered between the source and the drain of the transistor TRB[2] can be supplied to the circuit unit Si—C serving as a reading circuit. The potential difference between the source and the drain of the transistor TRB[1] is determined by the potential of the node FN[1] and the potential difference between the source and the drain of the transistor TRB[2] is determined by the potential of the node FN[2]. Hence, the potential maintained at the node FN[1] or the node FN[2] can be read by obtaining the voltage lowered between the source and the drain of the transistor TRB[1] or the voltage lowered between the source and the drain of the transistor TRB[2].

The transistors TRA[1], TRB[1], TRA[2], and TRB[2] each preferably include an oxide semiconductor. In particular, an oxide semiconductor containing at least one of indium, zinc, and gallium is further preferably used for channel formation regions of the transistors.

Figure 12:
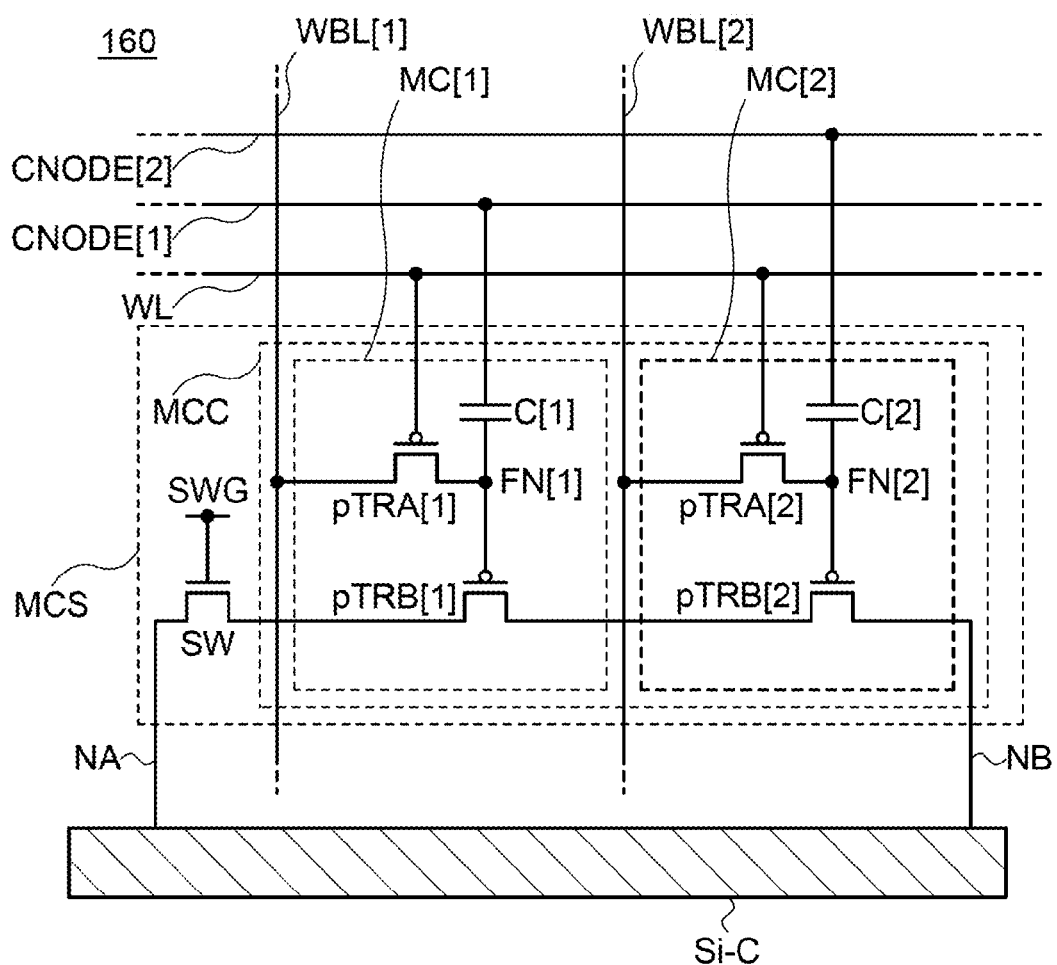
FIG. 12 is a circuit diagram of a semiconductor device of one embodiment of the present invention.

One embodiment of the present invention is not limited to the aforementioned semiconductor device 110. For example, as in a semiconductor device 160 illustrated in FIG. 12, p-channel transistors pTRA[1], pTRB[1], pTRA[2], and pTRB[2] may be used instead of the n-channel transistors TRA[1], TRB[1], TRA[2], and TRB[2] in the semiconductor device 110. Alternatively, not all but some of the n-channel transistors may be changed into p-channel transistors.

The memory cell of one embodiment of the present invention does not necessarily have 2-bit storage capacity. The memory cell can have 1-bit, 4-bit, 8-bit, or 9- or more-bit storage capacity in some cases by changing the components used in the memory cells MC[1] and MC[2] and the connection therebetween.

The position of the transistor SW of one embodiment of the present invention is not limited to that shown in the circuit diagram of FIG. 1. For example, the transistor SW may be provided on the node NB side or inside the circuit unit Si—C. In the case where Si is used for the channel formation region of the transistor SW, the effective cell area can be possibly made smaller than that using an oxide semiconductor. In the case where the circuit unit Si—C serving as a reading circuit has a large area, an oxide semiconductor may be preferably used for the channel formation region of the transistor SW.

Figure 13:
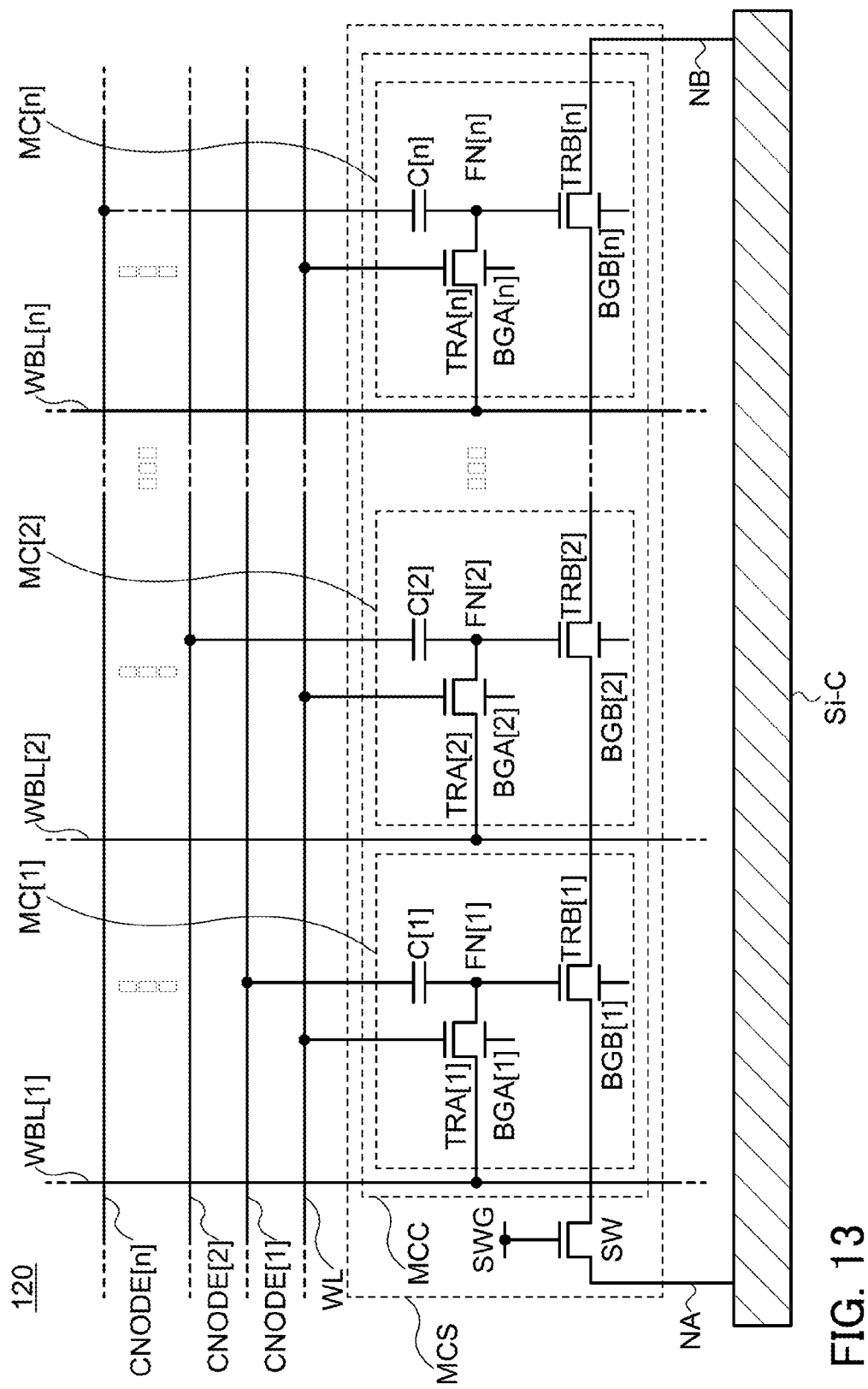
FIG. 13 is a circuit diagram of a semiconductor device of one embodiment of the present invention.

The semiconductor device 110 illustrated in FIG. 1 includes, but is not limited to, the two memory cells in one embodiment of the present invention. For example, three or more memory cells MC[i] may be connected in series as illustrated in FIG. 13, so that an n-bit semiconductor device 120 can be obtained (n is an integer of 1 or more, and in FIG. 13, i is an integer of 1 to n). The semiconductor device 120 includes a circuit unit MCS and the circuit unit Si—C. The circuit unit MCS includes the circuit unit MCC and the transistor SW. The circuit unit MCC includes memory cells MC[1] to MC[n]. The memory cell MC[i] includes the transistor TRA[i], the transistor TRB[i], and the capacitor C[i]. The transistor TRA[i] includes a back gate BGA[i] and the transistor TRB[i] includes a back gate BGB[i]. The memory cell MC[i] has the connection structure as illustrated in FIG. 2. The memory cell MC[i] is electrically connected to the wiring CNODE[i], the wiring WBL[i], and the wiring WL. The writing and reading operations of the semiconductor device 120 can be performed in a manner similar to those shown in the timing charts of FIGS. 8 and 9.

Figure 14:
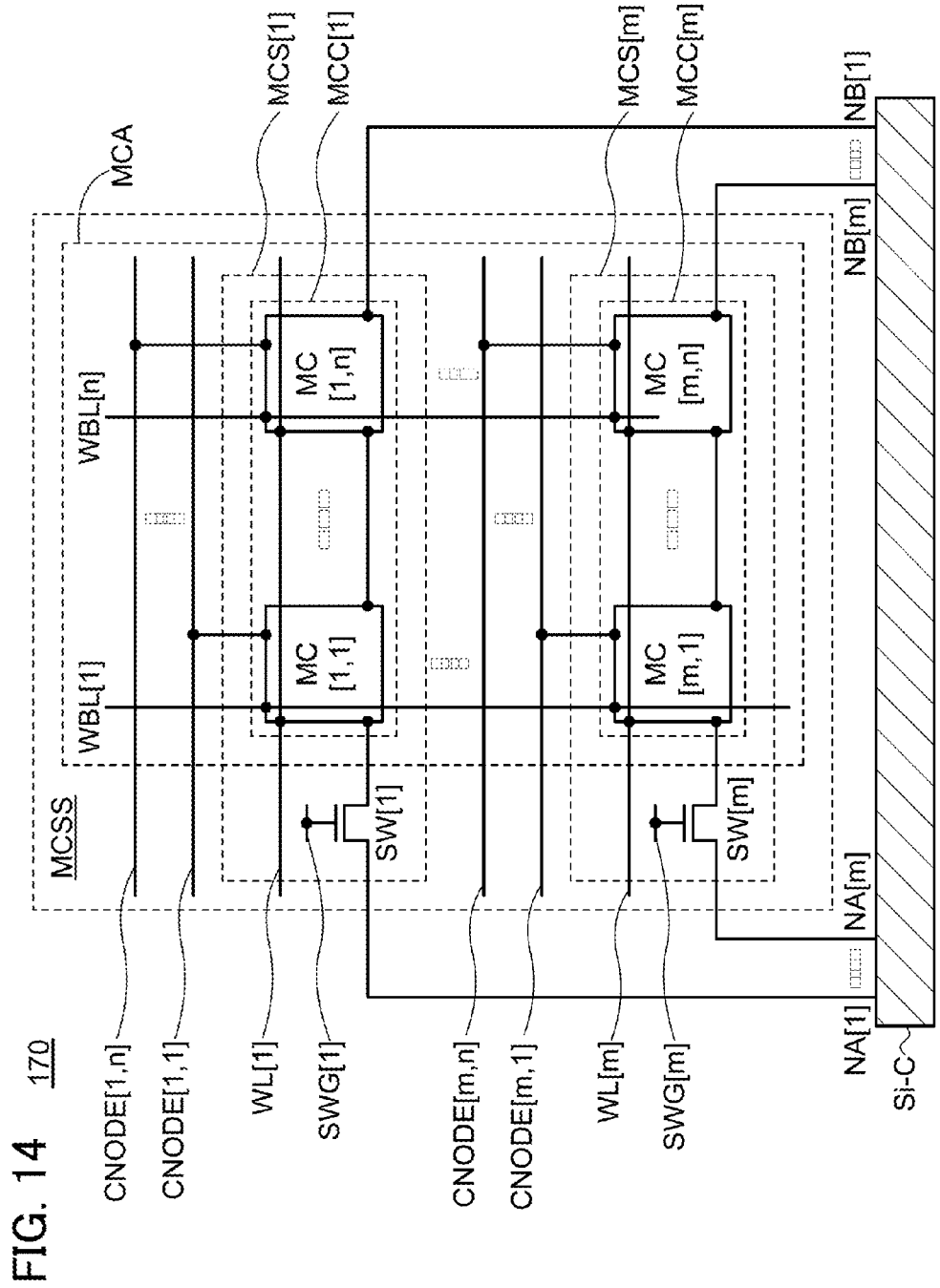
FIG. 14 illustrates a semiconductor device of one embodiment of the present invention.

The semiconductor device of one embodiment of the present invention is not limited to the semiconductor devices 110 and 120 illustrated in FIGS. 1 and 13, respectively. For example, as illustrated in FIG. 14, the semiconductor device may have a memory cell array including two or more semiconductor devices 120.

A semiconductor device 170 includes a circuit unit MCSS and the circuit unit Si—C. The circuit unit MCSS includes circuit units MCS[1] to MCS[m] (m is an integer of 2 or more). A circuit unit MCS[j] includes a circuit unit MCC[j] and a transistor SW[j] (in FIG. 14, j is an integer of 1 to m). A memory cell array MCA is constituted by the circuit units MCC[1] to MCC[m]. That is, the memory cell array MCA includes n memory cells in a row and m memory cells in a column, i.e., m×n memory cells in a matrix. Description is made here on the assumption that memory cells MC[1,1] to MC[m,n] each have a structure similar to that of the memory cell MC[i] in FIG. 2 (in FIG. 14, although not illustrated, i is an integer of 1 to n as in FIG. 13).

The semiconductor device 170 includes transistors SW[1] to SW[m], each of which corresponds to the transistor SW in the semiconductor device 120. Gates of the transistors SW[1] to SW[m] are electrically connected to the respective wirings SWG[1] to SWG[m]. One of a source and a drain of each of the transistors SW[1] to SW[m] is electrically connected to the corresponding one of the memory cells MC[1,1] to MC[m,1], and the other of the source and the drain of each of the transistors SW[1] to SW[m] is electrically connected to the corresponding one of the nodes NA[1] to NA[m]. The memory cells MC[1,n] to MC[m,n] are electrically connected to the nodes NB[1] to NB[m], respectively. The nodes NA[1] to NA[m] and the nodes NB[1] to NB[m] are electrically connected to the circuit unit Si—C.

In a j-th row, memory cells MC[j,1] to MC[j,n] are electrically connected in series to each other. For the connection of wirings CNODE[j,1] to CNODE[j,n] and a wiring WL[j] in the j-th row, the description of the wirings CNODE[1] and CNODE[2] and the wiring WL is referred to.

Note that in the semiconductor device 170 in FIG. 14, the memory cell array MCA, the memory cell MC[1,1], the memory cell MC[m,1], the memory cell MC[1,n], the memory cell MC[m,n], the wiring CNODE[1,1], the wiring CNODE[1,n], the wiring CNODE[m,1], the wiring CNODE[m,n], the wiring WL[1], the wiring WL[m], the wiring WBL[1], the wiring WBL[n], the wiring SWG[1], the wiring SWG[m], the node NA[1], the node NA[m], the node NB[1], the node NB[m], the transistor SW[1], the transistor SW[m], the circuit unit MCSS, the circuit unit MCS[1], the circuit unit MCS[m], the circuit unit MCC[1], the circuit unit MCC[m], and the circuit unit Si—C are only illustrated and other wirings, components, block diagrams, and reference numerals are omitted.

In order to perform a writing operation in the semiconductor device 170, any of the rows is selected by the wirings WL[1] to WL[m], and in a manner similar to that shown in the timing charts of FIGS. 8 and 9, a potential is supplied to any of the wirings WBL[1] to WBL[n].

In order to perform a reading operation in the semiconductor device 170, any of the rows is selected by the wirings SWG[1] to SWG[m] (here, the j-th row is selected), and in a manner similar to that shown in the timing charts of FIGS. 8 and 9, a potential is supplied to any of the wirings CNODE[j,1] to CNODE[j,n] in the selected j-th row.

The memory cells MC[1,1] to MC[m,n] included in the memory cell array MCA in FIG. 14 may have the pMC[i] structure illustrated in FIG. 7 without limitation to the memory cell MC[i] structure illustrated in FIG. 2.

The configuration of the memory cell array of one embodiment of the present invention is not limited to that illustrated in FIG. 14. For example, the circuit units MCS are not necessarily provided in each row as illustrated in FIG. 14, but they may be provided in a matrix as illustrated in FIG. 15.

A semiconductor device 180 includes m circuit units MCS in a column and n circuit units MCS in a row, i.e., m×n circuit units MCS in a matrix. Here, circuit units MCS[1,1] to MCS[m,n] are arranged in a matrix. A circuit unit MCS[0] includes the memory cell MC[1] to a memory cell MC[k] each having a configuration similar to that of the memory cell MC[i] illustrated in FIG. 2 (k is an integer of 2 or more). Although not illustrated in FIG. 15, the circuit unit Si—C is also included in the semiconductor device 180.

Figure 15:
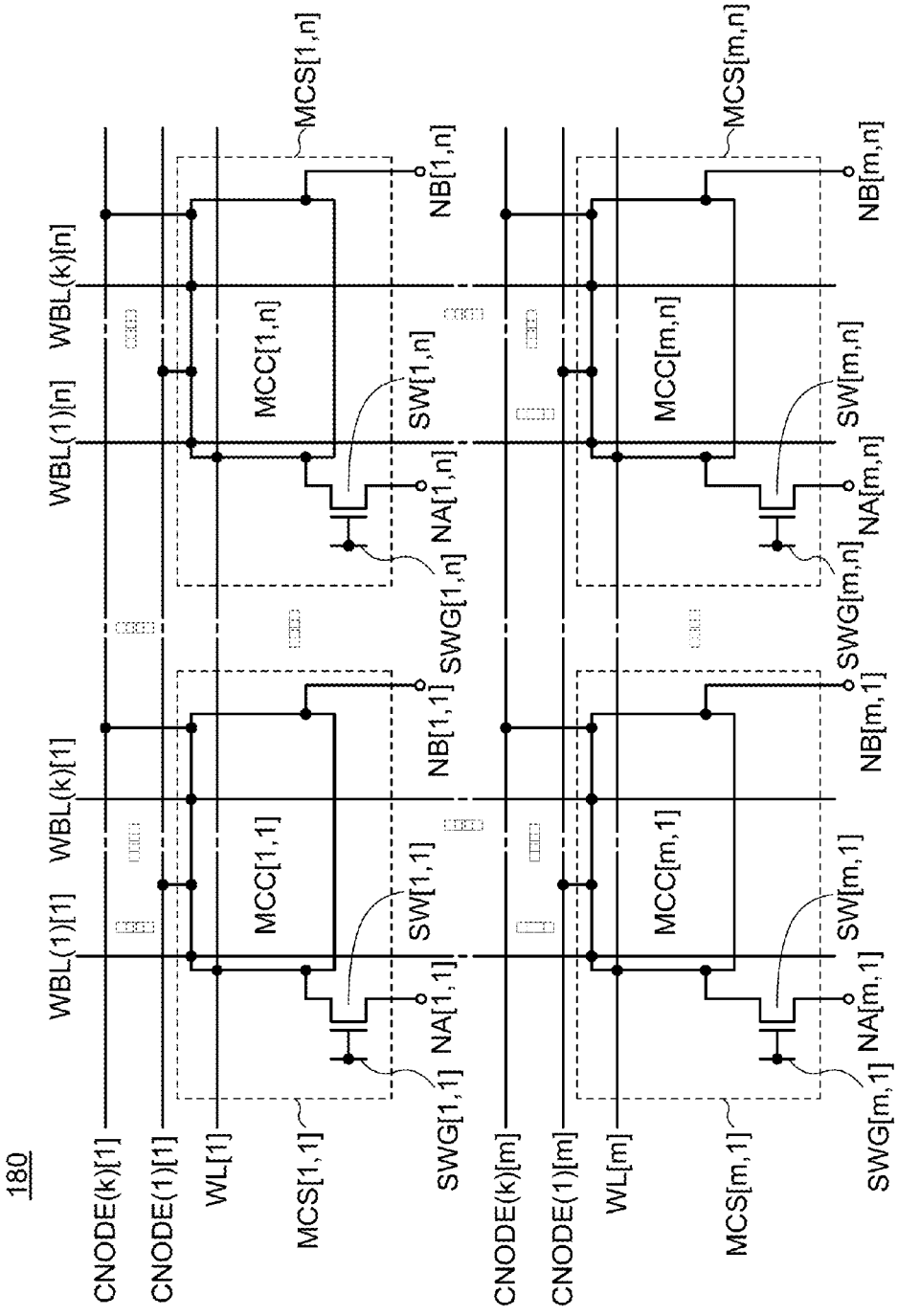
FIG. 15 illustrates a semiconductor device of one embodiment of the present invention.

In the j-th row and the i-th column, the circuit unit MCS[j,i] includes a transistor SW[j,i] and a circuit unit MCC[j,i] (for the possible values of i and j in FIG. 15, the description of FIG. 14 is referred to). One of a source and a drain of the transistor SW[j,i] is electrically connected to the circuit unit MCC[j,i], a gate of the transistor SW[j,i] is electrically connected to a wiring SWG[j,i], and the other of the source and the drain of the transistor SW[j,i] is electrically connected to a node NA[j,i]. A node NB[j,i] is electrically connected to the circuit unit MCC[j,i]. The node NA[j,i] and the node NB[j,i] are electrically connected to the circuit unit Si—C (not illustrated).

In the j-th row, circuit units MCC[j,1] to MCC[j,n] are electrically connected to the wiring WL[j]. Wirings CNODE(1)[j] to CNODE(k)[j] are electrically connected to the circuit units MCC[j,1] to MCC[j,n]. In particular, a wiring CNODE(h)[j] is electrically connected to a memory cell MC[h] included in each of the circuit units MCC[j,1] to MCC[j,n] (h is an integer of 1 to k).

In the i-th column, circuit units MCC[1,*i*] to MCC[m,i] are electrically connected to wirings WBL(1)[*i*] to WBL(k)[i]. In particular, the wiring WBL(h)[i] is electrically connected to the memory cell MC[h] included in each of the circuit units MCC[1,*i*] to MCC[m,i].

Note that in the semiconductor device 180 in FIG. 15, the circuit units MCS[1,1], MCS[m,1], MCS[1,*n*], and MCS[m,n], the circuit units MCC[1,1], MCC[m,1], MCC[1,*n*], and MCC[m,n], the transistors SW[1,1], SW[m,1], SW[1,*n*], and SW[m,n], the wirings SWG[1,1], SWG[m,1], SWG[1,*n*], and SWG[m,n], the nodes NA[1,1], NA[m,1], NA[1,*n*], and NA[m,n], the nodes NB[1,1], NB[m,1], NB[1,*n*], and NB[m,n], the wirings WL[1] and WL[m], the wirings WBL(1)[1], WBL(k)[1], WBL(1)[*n*], and WBL(k)[n], the wirings CNODE(1)[1], CNODE(k)[1], CNODE(1)[m], and CNODE(k)[m] are only illustrated and other wirings, components, block diagrams, and reference numerals are omitted.

In order to perform a writing operation in the semiconductor device 180, any of the rows is selected by the wirings WL[1] to WL[m], and in a manner similar to that shown in the timing charts of FIGS. 8 and 9, a potential is supplied to any of the wirings WBL(1)[1] to WBL(k)[n].

In order to perform a reading operation in the semiconductor device 180, any of the rows is selected by the wirings SWG[1,1] to SWG[m,n] (here, the j-th row is selected), and in a manner similar to that shown in the timing charts of FIGS. 8 and 9, a potential is supplied to any of the wirings CNODE(1)[*j*] to CNODE(k)[j].

Figure 16:
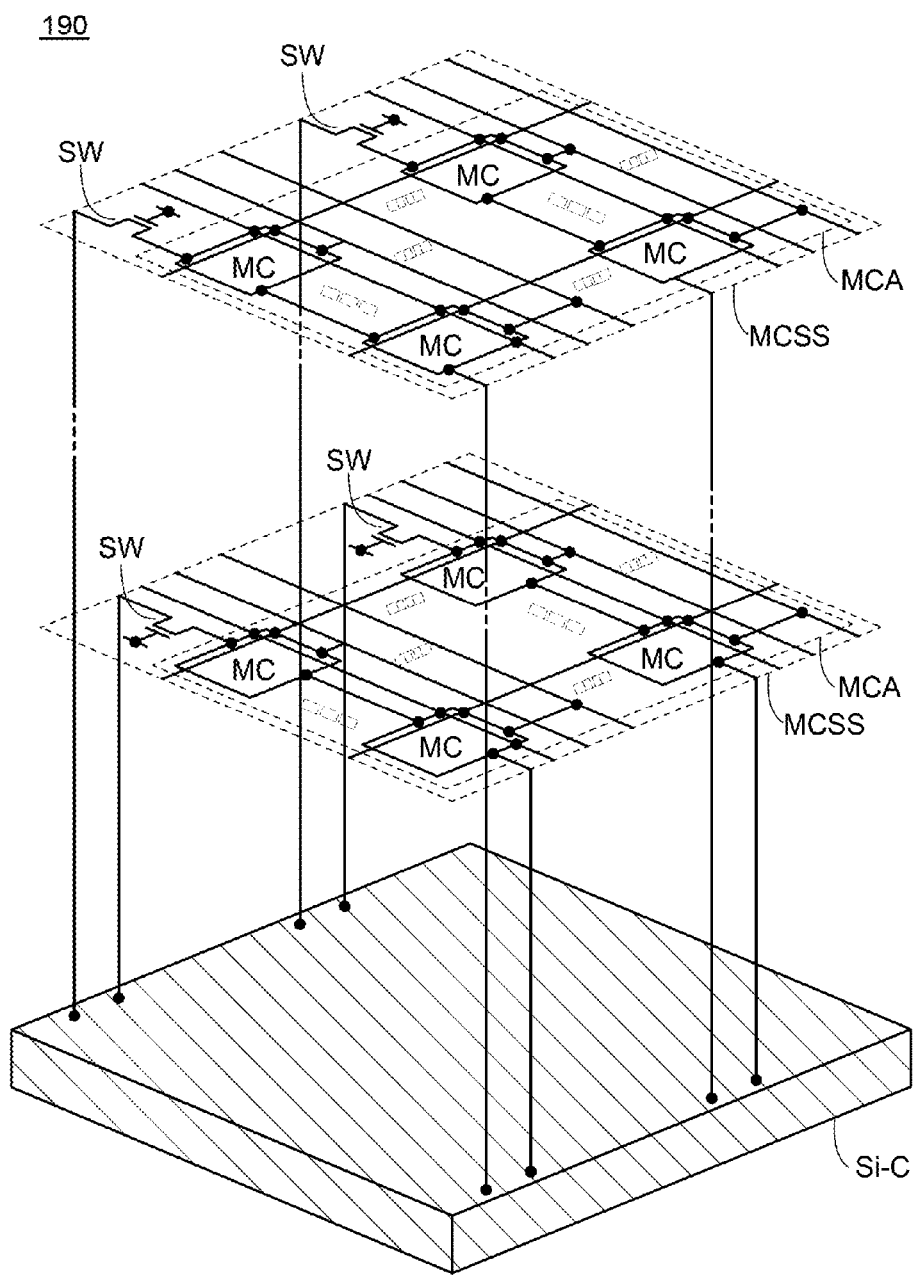
FIG. 16 illustrates a semiconductor device of one embodiment of the present invention.

The semiconductor device of one embodiment of the present invention is not limited to the semiconductor device 110 in FIG. 1, the semiconductor device 120 in FIG. 13, the semiconductor device 170 in FIG. 14, and the semiconductor device 180 in FIG. 15. For example, as illustrated in FIG. 16, the semiconductor device may have a stack of two or more memory cell arrays MCA.

A semiconductor device 190 includes a plurality of circuit units MCSS and the circuit unit Si—C. The circuit unit MCSS included in the semiconductor device 190 may have a configuration similar to that of the memory cell array MCA in the semiconductor device 170. The circuit units MCSS are electrically connected to the circuit unit Si—C.

In the semiconductor device 190, the memory cell arrays MCA in the circuit units MCSS overlap with each other.

The transistor SW in each circuit unit MCSS need not be stacked with the memory cell array MCA. In particular, in the case where the transistor SW is formed using a material different from that of the transistors TRA and TRB in the memory cell MC, the transistor SW is preferably provided outside the circuit unit MCSS.

The memory cell MC in the memory cell array MCA may have the configuration of the memory cell MC[i] in FIG. 2 or the configuration of pMC[i] in FIG. 7.

Although the two layers of the circuit units MCSS are stacked in FIG. 16, one embodiment of the present invention is not limited thereto and three layers of the circuit units MCSS may be stacked.

Such a stack of the circuit units MCSS achieves a memory device with a larger storage capacity.

Note that an example described as one embodiment of the present invention in this embodiment can be combined with any of the other examples as appropriate.

In this embodiment, one embodiment of the present invention has been described. Embodiments of the present invention are described in other embodiments. Note that one embodiment of the present invention is not limited to the above examples. In other words, various embodiments of the invention are described in this embodiment and the other embodiments, and one embodiment of the present invention is not limited to a particular embodiment. For example, as one embodiment of the present invention, an oxide semiconductor is used for the channel formation region of the transistor, which includes the semiconductors 101a and 101b, the source and drain regions, and the like; however, one embodiment of the present invention is not limited to this example. Depending on the circumstances or case, a variety of semiconductors may be used for transistors in one embodiment of the present invention, the channel formation regions of the transistors, the source and drain regions of the transistors, and the like. Depending on the circumstances or case, transistors in one embodiment of the present invention, the channel formation regions of the transistors, the source and drain regions of the transistors, and the like may include, for example, at least one of silicon, germanium, silicon germanium, silicon carbide, gallium arsenide, aluminum gallium arsenide, indium phosphide, gallium nitride, and an organic semiconductor. Depending on the circumstances or case, transistors in one embodiment of the present invention, the channel formation regions of the transistors, the source and drain regions of the transistors, and the like do not necessarily include an oxide semiconductor. Depending on the circumstances or case, the transistor including the semiconductors 101a and 101b and the like, the channel formation region of the transistor, the source and drain regions of the transistor, and the like do not necessarily include an oxide semiconductor. For example, an example of application to a memory cell is described as one embodiment of the present invention; however, one embodiment of the present invention is not limited thereto. Depending on the circumstances or case, for example, one embodiment of the present invention may be applied to a circuit having another function. Depending on the circumstances or case, one embodiment of the present invention is not necessarily applied to a memory cell.

This embodiment can be combined as appropriate with any of the other embodiments described in this specification.

Embodiment 2

A configuration example of a memory device of one embodiment of the present invention will be described with reference to FIG. 17.

Figure 17:
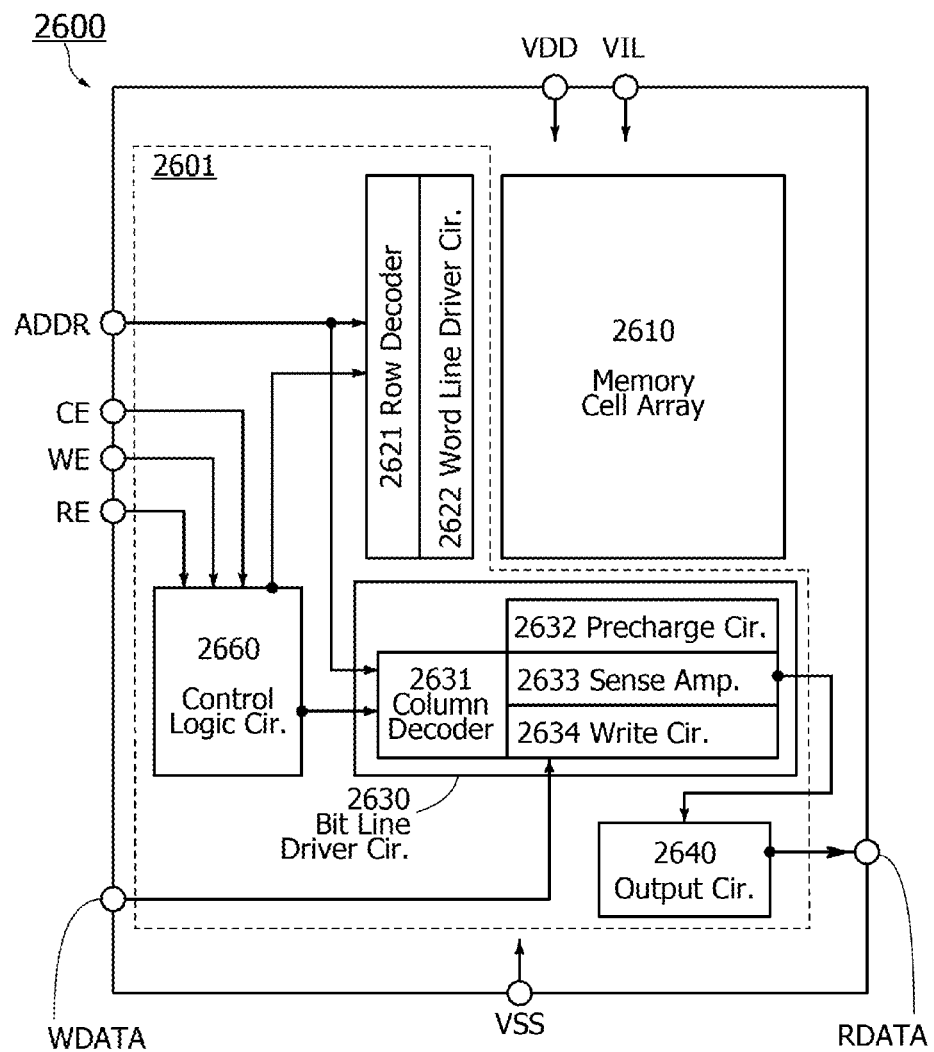
FIG. 17 illustrates a memory device of one embodiment of the present invention.

FIG. 17 illustrates a configuration example of a memory device. A memory device 2600 includes a peripheral circuit 2601 and a memory cell array 2610 (denoted by Memory Cell Array in FIG. 17). The peripheral circuit 2601 includes a row decoder 2621 (denoted by Row Decoder in FIG. 17), a word line driver circuit 2622 (abbreviated to Word Line Driver Cir. in FIG. 17), a bit line driver circuit 2630 (abbreviated to Bit Line Driver Cir. in FIG. 17), an output circuit 2640 (abbreviated to Output Cir. in FIG. 17), and a control logic circuit 2660 (abbreviated to Control Logic Cir. in FIG. 17).

The bit line driver circuit 2630 includes a column decoder 2631 (denoted by Column Decoder in FIG. 17), a precharge circuit 2632 (abbreviated to Precharge Cir. in FIG. 17), a sense amplifier 2633 (abbreviated to Sense Amp. in FIG. 17), and a write circuit 2634 (abbreviated to Write Cir. in FIG. 17). The precharge circuit 2632 has a function of precharging the node NA, the wiring CNODE[i], and the like (not illustrated in FIG. 17). The sense amplifier 2633 has a function of amplifying a data signal input from the node NB. The amplified data signal is output as a digital data signal RDATA from the memory device 2600 through the output circuit 2640.

Note that the precharge circuit 2632 and the sense amplifier 2633 are not necessarily provided in the bit line driver circuit 2630 as shown in FIG. 17, but may be provided in the circuit unit Si—C which is under the memory cell array 2610 as described in Embodiment 1 (the circuit unit Si—C is not illustrated in FIG. 17).

As power source voltages, a low power source voltage (VSS), a high power source voltage (VDD) for the peripheral circuit 2601, and a high power source voltage (VIL) for the memory cell array 2610 are supplied to the memory device 2600 from the outside.

Control signals (CE, WE, and RE), an address signal ADDR, and a data signal WDATA are input to the memory device 2600 from the outside. ADDR is input to the row decoder 2621 and the column decoder 2631, and WDATA is input to the write circuit 2634.

The control logic circuit 2660 processes the signals (CE, WE, RE) input from the outside, and generates control signals for the row decoder 2621 and the column decoder 2631. CE, WE, and RE are a chip enable signal, a write enable signal, and a read enable signal, respectively. Signals processed by the control logic circuit 2660 are not limited to those listed above, and other control signals may be input as necessary.

Note that whether each of the aforementioned circuits or signals is provided can be determined as appropriate and as needed.

When a p-channel Si transistor and a transistor including a channel formation region using an oxide semiconductor (preferably an oxide containing In, Ga, and Zn) described in a later embodiment are used in the memory device 2600, the memory device 2600 can be reduced in size. In addition, the memory device 2600 can be reduced in power consumption. Furthermore, the memory device 2600 can be increased in operation speed. In particular, by using only a p-channel transistor as the Si-transistor, manufacturing costs can be reduced.

Note that the configuration of this embodiment is not limited to that illustrated in FIG. 17. Depending on the circumstances or case, the structure of the memory device 2600 may be changed. For example, in the case where either the memory cell MC[i] or the memory cell pMC[i] shown in Embodiment 1 is used for the memory device 2600, the number of wirings and the configuration of the peripheral circuit may be changed as appropriate in accordance with the memory cell. Also in the case where any of the semiconductor devices 120, 170, 180, and 190 is used for the memory device 2600, the number of wirings and the configuration of the peripheral circuit may be changed as appropriate in accordance with the semiconductor device.

This embodiment can be combined as appropriate with any of the other embodiments described in this specification.

Embodiment 3

OS transistors (transistors including an oxide semiconductor) will be described.

<Structure Example 1 of OS Transistor>

Figure 18A:
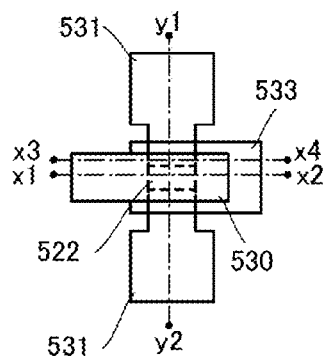
FIGS. 18A to 18D illustrate structure examples of OS transistors: A, a top view; B, a cross-sectional view along dashed-dotted line y1-y2; C, a cross-sectional view along dashed-dotted line x1-x2; and D, a cross-sectional view along dashed-dotted line x3-x4.
Figure 18B:
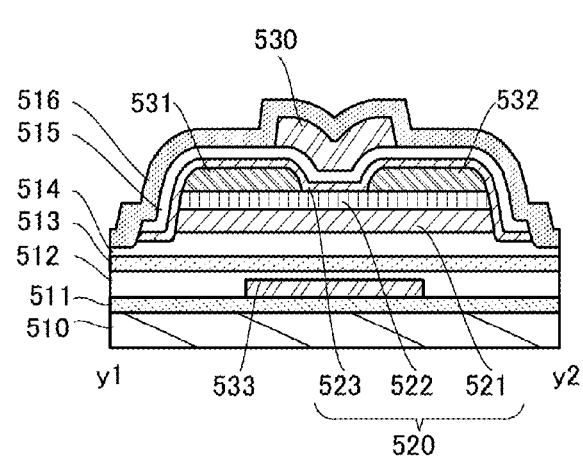
Figure 18C:
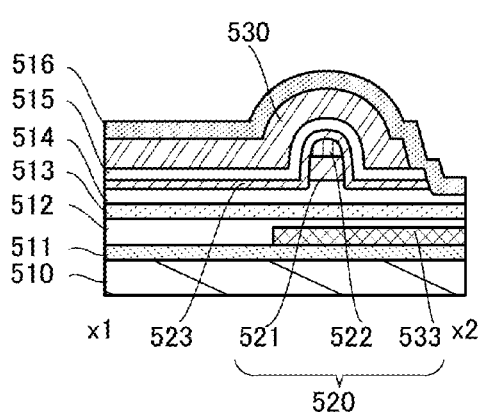
Figure 18D:
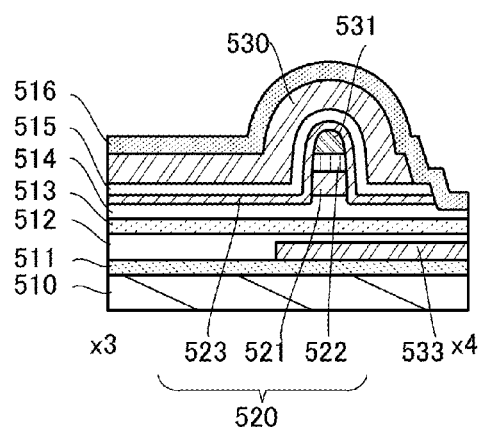

FIGS. 18A to 18D illustrate a structure example of an OS transistor. FIG. 18A is a top view illustrating a structure example of an OS transistor. FIG. 18B is a cross-sectional view along dashed-dotted line y1-y2 in FIG. 18A. FIG. 18C is a cross-sectional view along dashed-dotted line x1-x2 in FIG. 18A. FIG. 18D is a cross-sectional view along dashed-dotted line x3-x4 in FIG. 18A. In some cases, the direction of dashed-dotted line y1-y2 is referred to as a channel length direction, and the direction of dashed-dotted line x1-x2 is referred to as a channel width direction. Accordingly, FIG. 18B illustrates a cross-sectional structure of the OS transistor in the channel length direction, and FIGS. 18C and 18D each illustrate a cross-sectional structure of the OS transistor in the channel width direction. Note that to clarify the device structure, FIG. 18A does not illustrate some components.

An OS transistor 581 is formed over an insulating surface, here, over an insulator 511. The insulator 511 is formed over a surface of a substrate 510. The OS transistor 581 is covered with an insulator 516. Note that the insulator 516 can be regarded as a component of the OS transistor 581. The OS transistor 581 includes an insulator 512, an insulator 513, an insulator 514, an insulator 515, semiconductors 521 to 523, a conductor 530, a conductor 531, a conductor 532, and a conductor 533. Here, the semiconductors 521 to 523 are collectively referred to as a semiconductor region 520.

The conductor 530 serves as a gate electrode and the conductor 533 serves as a back gate electrode. The conductors 531 and 532 each serve as a source or a drain electrode. The insulator 511 has a function of electrically isolating the substrate 510 from the conductor 533. The insulator 515 is included in a gate insulator and the insulators 513 and 514 are included in a gate insulator on a back channel side.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification and the like, the channel length is any one of values, the maximum value, the minimum value, or the average value in a region where a channel is formed.

As illustrated in FIGS. 18B and 18C, the semiconductor region 520 includes a region where the semiconductors 521 to 523 are stacked in order. The insulator 515 covers this stacked region. The conductor 530 overlaps with the stacked region with the insulator 514 positioned therebetween. The conductors 531 and 532 are provided over a stack of the semiconductors 521 and 522, and are in contact with a top surface of the stack and a side surface thereof in the channel length region. The stack of the semiconductors 521 and 522 and the conductors 531 and 532 is formed in an etching step using the same mask.

The semiconductor 523 is formed to cover the semiconductors 521 and 522 and the conductors 531 and 532. The insulator 515 covers the semiconductor 523. Here, the semiconductor 523 and the insulator 515 are etched using the same mask.

The conductor 530 is formed so as to surround, in the channel width direction, the stack of the semiconductors 521 to 523 with the insulator 515 positioned therebetween (see FIG. 18C). Therefore, a gate electric field is applied to this stacked region in the lateral direction as well as the vertical direction. In the OS transistor 581, the gate electric field refers to an electric field generated by voltage applied to the conductor 530 (gate electrode layer). Such a structure of the transistor in which the whole stacked region of the semiconductors 521 to 523 can be electrically surrounded by the gate electric fields is referred to as a surrounded channel (s-channel) structure. This structure makes a channel in the whole semiconductor 522 (bulk) in some cases; thus, the OS transistor 581 can have a high on-state current. The OS transistor 581 with the s-channel structure has an improved high frequency property. Specifically, the cut-off frequency can be improved.

The s-channel structure, because of its high on-state current, is suitable for a semiconductor device such as large-scale integration (LSI) which requires a miniaturized transistor. Furthermore, the s-channel structure is suitable for a transistor that needs to operate at high frequency because of its high on-state current. A semiconductor device including the transistor can operate at high frequency.

With the miniaturized transistor, a highly integrated or small sized semiconductor device can be provided. The OS transistor preferably has, for example, a region where a channel length is greater than or equal to 10 nm and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm. In addition, the transistor preferably has, for example, a region where a channel width is greater than or equal to 10 nm and less than 1 μm, further preferably greater than or equal to 10 nm and less than 100 nm, still further preferably greater than or equal to 10 nm and less than 70 nm, yet still further preferably greater than or equal to 10 nm and less than 60 nm, and yet still further preferably greater than or equal to 10 nm and less than 30 nm.

<Insulator>

Each of the insulators 511 to 516 includes a single layer or multilayer insulating film. The insulating film is formed using, for example, a material such as aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Note that in this specification, an oxynitride refers to a compound that includes more oxygen than nitrogen, and a nitride oxide refers to a compound that includes more nitrogen than oxygen. In this specification and the like, an oxide used for an insulating material includes an oxide with a nitrogen concentration of less than 1 atomic %.

The insulators 514 and 515 are in contact with the semiconductor region 520 and therefore preferably contain an oxide. In particular, the insulators 514 and 515 preferably include an oxide material from which part of oxygen is released by heating. The insulators 514 and 515 preferably include an oxide containing oxygen more than that in the stoichiometric composition. By heating, part of oxygen is released from an oxide film containing oxygen more than that in the stoichiometric composition. Oxygen released from the insulators 514 and 515 is supplied to the semiconductor region 520 which is an oxide semiconductor, so that oxygen vacancies in the oxide semiconductor can be reduced. Consequently, changes in the electrical characteristics of the transistor can be reduced, improving the reliability of the transistor.

The oxide film containing oxygen more than that in the stoichiometric composition is, for example, an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis under the conditions where the temperature of the film surface is higher than or equal to 100° C. and lower than or equal to 700° C. Note that the temperature of the film surface in the TDS analysis is preferably higher than or equal to 100° C. and lower than or equal to 700° C., or higher than or equal to 100° C. and lower than or equal to 500° C.

The insulator 513 has a passivation function of preventing oxygen included in the insulator 514 from decreasing by being bonded to metal included in the conductor 533. The insulator 516 has a passivation function of preventing oxygen included in the insulator 515 from decreasing.

The insulators 511, 513, and 516 preferably have a function of blocking oxygen, hydrogen, water, alkali metal, alkaline earth metal, or the like. The insulators 511, 513, and 516 prevent outward diffusion of oxygen from the semiconductor region 520 and entry of hydrogen, water, or the like into the semiconductor region 520 from the outside. To have such a function, the insulators 511, 513, and 516 include, for example, at least a single layer of an insulating film made of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like.

<Conductor>

The conductors 530, 531, 532, and 533 each preferably have a single layer or a multilayer of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductors are preferably formed using a low-resistance conductive material such as aluminum or copper. The conductors are further preferably formed using a Cu—Mn alloy, in which case manganese oxide formed at the interface with an insulator containing oxygen has a function of preventing Cu diffusion.

The conductors 531 and 532 in the OS transistor 581 are formed using a hard mask used for forming the stack of the semiconductors 521 and 522. Therefore, the conductors 531 and 532 do not have regions in contact with the side surfaces of the semiconductors 521 and 522. For example, the semiconductors 521 and 522 and the conductors 531 and 532 can be formed through the following steps. A two-layer oxide semiconductor film including the semiconductors 521 and 522 is formed. A single-layer or multilayer conductive film is formed over the oxide semiconductor film. This conductive film is etched, so that a hard mask is formed. Using this hard mask, the two-layer oxide semiconductor film is etched to form the semiconductors 521 and 522. Then, the hard mask is etched to form the conductors 531 and 532.

<Semiconductor>

The semiconductor 522 is, for example, an oxide semiconductor containing indium (In). The semiconductor 522 has a high carrier mobility (electron mobility) when containing, for example, indium. The semiconductor 522 preferably contains an element M. The element M is preferably aluminum (Al), gallium (Ga), yttrium (Y), tin (Sn), or the like. Other elements that can be used as the element M include boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), and tungsten (W). Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 522 preferably contains zinc (Zn). The oxide semiconductor containing zinc is easily crystallized in some cases.

Note that the semiconductor 522 is not limited to the oxide semiconductor containing indium. The semiconductor 522 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide. The semiconductor 522 is formed using an oxide with a wide energy gap. For example, the energy gap of the semiconductor 522 is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV. The semiconductor region 520 is preferably formed using CAAC-OS which is described later. Alternatively, at least the semiconductor 522 is preferably formed using CAAC-OS.

The semiconductors 521 and 523 include, for example, one or more elements other than oxygen included in the semiconductor 522. Since the semiconductors 521 and 523 each include one or more elements other than oxygen included in the semiconductor 522, an interface state is less likely to be formed at the interface between the semiconductors 521 and 522 and the interface between the semiconductors 522 and 523.

In the case where an In-M-Zn oxide is used as the semiconductor 521, when the summation of In and M is assumed to be 100 atomic %, the proportions of In and M are preferably set to be lower than 50 atomic % and higher than 50 atomic %, respectively, further preferably lower than 25 atomic % and higher than 75 atomic %, respectively. In the case where the semiconductor 521 is formed by a sputtering method, a sputtering target with the above composition, for example, a sputtering target containing In, M, and Zn at an atomic ratio of 1:3:2, is preferably used.

In the case where an In-M-Zn oxide is used as the semiconductor 522, when the summation of In and M is assumed to be 100 atomic %, the proportions of In and M are preferably set to be higher than 25 atomic % and lower than 75 atomic %, respectively, further preferably higher than 34 atomic % and lower than 66 atomic %, respectively. In the case where the semiconductor 522 is formed by a sputtering method, a sputtering target with the above composition, for example, a sputtering target containing In, M, and Zn at an atomic ratio of 1:1:1, 1:1:1.2, 2:1:3, 3:1:2, or 4:2:4.1, is preferably used. In particular, when a sputtering target containing In, Ga, and Zn at an atomic ratio of 4:2:4.1 is used, the semiconductor 522 may contain In, Ga, and Zn at an atomic ratio of around 4:2:3.

In the case where an In-M-Zn oxide is used as the semiconductor 523, when the summation of In and M is assumed to be 100 atomic %, the proportions of In and M are preferably set to be lower than 50 atomic % and higher than 50 atomic %, respectively, further preferably lower than 25 atomic % and higher than 75 atomic %, respectively. Note that the semiconductors 523 and 521 may be formed using the same type of oxide. Note that the semiconductor 521 and/or the semiconductor 523 do/does not necessarily contain indium in some cases. For example, the semiconductor 521 and/or the semiconductor 523 may be gallium oxide.

(Energy Band Structure)

Figure 19A:
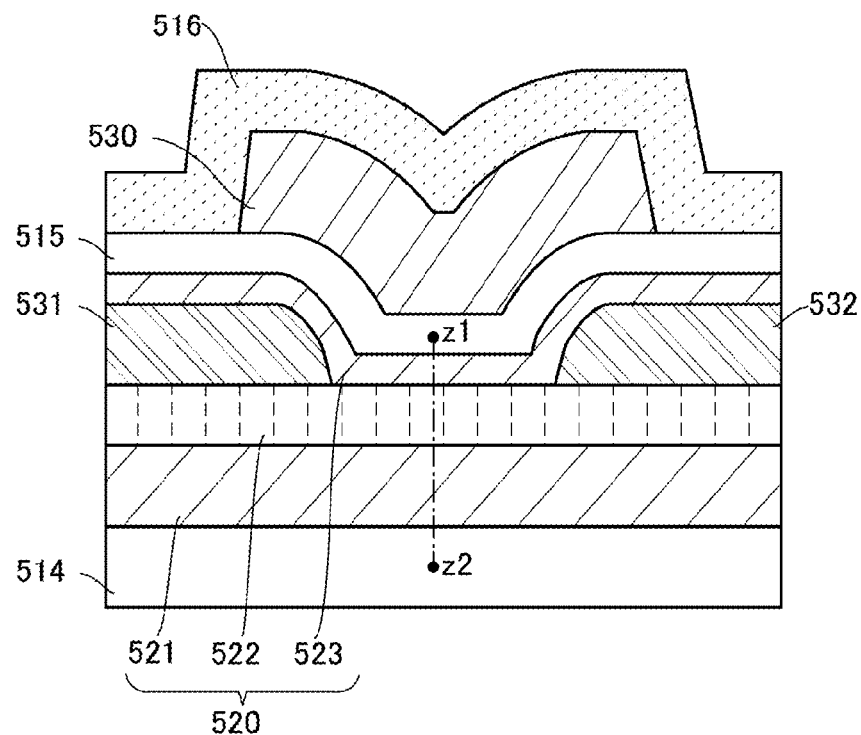
FIG. 19A is an enlarged view of part of FIG. 18B.
Figure 19B:
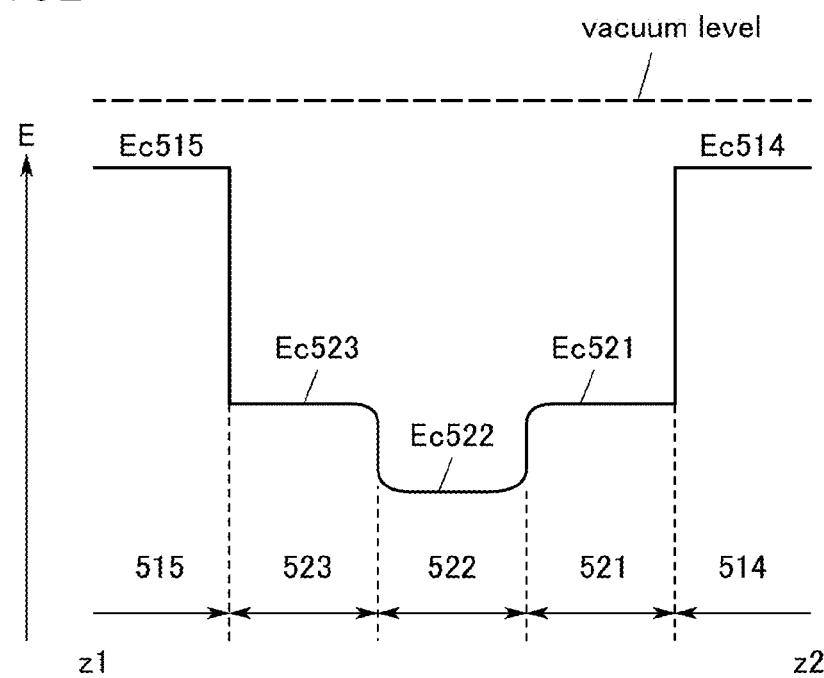
FIG. 19B is an energy band diagram of an OS transistor.

A function and an effect of the semiconductor region 520 including the stack of the semiconductors 521, 522, and 523 will be described with reference to FIGS. 19A and 19B. FIG. 19A is an enlarged view of the active layer (the channel portion) of the OS transistor 581 illustrated in FIG. 18B. FIG. 19B shows an energy band diagram of the active layer of the OS transistor 581, i.e., the energy band diagram of a portion along chain line z1-z2 in FIG. 19A.

In FIG. 19B, Ec514, Ec521, Ec522, Ec523, and Ec515 indicate the energy of the conduction band minimum of the insulator 514, the semiconductor 521, the semiconductor 522, the semiconductor 523, and the insulator 515, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulators 514 and 515 are insulators, Ec514 and Ec515 are closer to the vacuum level than Ec521, Ec522, and Ec523 (that is, the insulators 514 and 515 have a smaller electron affinity than the semiconductors 521 to 523).

As the semiconductor 522, an oxide having an electron affinity higher than those of the semiconductors 521 and 523 is used. For example, as the semiconductor 522, an oxide having an electron affinity higher than those of the semiconductors 521 and 523 by 0.07 eV or higher and 1.3 eV or lower, preferably 0.1 eV or higher and 0.7 eV or lower, and further preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor 523 preferably contains an indium gallium oxide. The gallium atomic ratio [Ga/(In+Ga)] is, for example, higher than or equal to 70%, preferably higher than or equal to 80%, and further preferably higher than or equal to 90%. At this time, when a gate voltage is applied, a channel is formed in the semiconductor 522 having the highest electron affinity among the semiconductors 521 to 523.

Here, in some cases, there is a mixed region of the semiconductors 521 and 522 between the semiconductor 521 and the semiconductor 522. Furthermore, in some cases, there is a mixed region of the semiconductors 522 and 523 between the semiconductor 522 and the semiconductor 523. The mixed region has a low interface state density. For that reason, the stack of the semiconductors 521, 522, and 523 has a band structure where energy at each interface and in the vicinity of the interface is changed continuously (also referred to as a band structure with a continuous junction).

At this time, electrons move mainly in the semiconductor 522, not in the semiconductors 521 and 523. As described above, when the interface state density at the interface between the semiconductors 521 and 522 and the interface state density at the interface between the semiconductors 522 and 523 are decreased, electron movement in the semiconductor 522 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large. The electron movement is also inhibited, for example, in the case where the density of defect states is high in a region where a channel is formed.

To increase the on-state current of the OS transistor 581, for example, root mean square (RMS) roughness with a measurement area of 1 μm×1 μm of a top surface or a bottom surface of the semiconductor 522 (a formation surface; here, the semiconductor 521) is less than 1 nm, preferably less than 0.6 nm, further preferably less than 0.5 nm, and still further preferably less than 0.4 nm. The average surface roughness (also referred to as Ra) with the measurement area of 1 μm×1 μm is less than 1 nm, preferably less than 0.6 nm, further preferably less than 0.5 nm, and still further preferably less than 0.4 nm. The maximum difference (P–V) with the measurement area of 1 μm×1 μm is less than 10 nm, preferably less than 9 nm, further preferably less than 8 nm, and still further preferably less than 7 nm. Note that RMS roughness, Ra, and P–V can be measured using a scanning probe microscope.

For example, in the case where the semiconductor 522 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ scatters electrons to be a factor of decreasing the on-state current of the transistor. Note that sites of oxygen vacancies are more stable by entry of oxygen than by entry of hydrogen. Thus, a decrease in oxygen vacancies in the semiconductor 522 results in an increase in the on-state current of the transistor in some cases.

For example, the hydrogen concentration at a certain depth in the semiconductor 522 or in a certain region of the semiconductor 522, which is measured by secondary ion mass spectrometry (SIMS), is higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, further preferably higher than or equal to $1 \times 10^{16}$ atoms/cm$^3$ and lower than or equal to $1 \times 10^{19}$ atoms/cm$^3$, and still further preferably higher than or equal to $1 \times 10^{16}$ atoms/cm$^3$ and lower than or equal to $5 \times 10^{18}$ atoms/cm$^3$.

To decrease oxygen vacancies in the semiconductor 522, for example, excess oxygen in the insulator 515 can be moved to the semiconductor 522 through the semiconductor 521. In this case, the semiconductor 521 is preferably a layer having oxygen permeability (a layer through which oxygen can permeate).

In the case where the OS transistor 581 has an s-channel structure, a channel is formed in the whole of the semiconductor 522. Therefore, as the semiconductor 522 has a larger thickness, a channel region becomes larger. In other words, the thicker the semiconductor 522 is, the higher the on-state current of the OS transistor 581 is.

Moreover, the thickness of the semiconductor 523 is preferably as small as possible to increase the on-state current of the OS transistor 581. For example, the semiconductor 523 has a region with a thickness of less than 10 nm, preferably less than or equal to 5 nm, and further preferably less than or equal to 3 nm. Meanwhile, the semiconductor 523 has a function of blocking entry of elements other than oxygen (such as hydrogen and silicon) included in the adjacent insulator into the semiconductor 522 where a channel is formed. For this reason, it is preferable that the semiconductor 523 have a certain thickness. For example, the semiconductor 523 has a region with a thickness of greater than or equal to 0.3 nm, preferably greater than or equal to 1 nm, and further preferably greater than or equal to 2 nm. The semiconductor 523 preferably has an oxygen blocking property to suppress outward diffusion of oxygen released from the insulator 515 and the like.

To improve the reliability of the OS transistor 581, preferably, the thickness of the semiconductor 521 is large and the thickness of the semiconductor 523 is small. For example, the semiconductor 521 has a region with a thickness of greater than or equal to 10 nm, preferably greater than or equal to 20 nm, further preferably greater than or equal to 40 nm, and still further preferably greater than or equal to 60 nm. When the thickness of the semiconductor 521 is made large, the distance from an interface between the adjacent insulator and the semiconductor 521 to the semiconductor 522 in which a channel is formed can be large. However, to prevent the productivity of the semiconductor device from decreasing, the semiconductor 521 has a region with a thickness of, for example, less than or equal to 200 nm, preferably less than or equal to 120 nm, and further preferably less than or equal to 80 nm.

In order that the OS transistor 581 have stable electrical characteristics, it is effective to make the semiconductor 522 intrinsic or substantially intrinsic by reducing the concentration of impurities in the semiconductor region 520. Note that in this specification and the like, the expression "an oxide semiconductor is substantially intrinsic" refers to a state where an oxide semiconductor film has a carrier density lower than $8\times10^{11}/cm^3$, preferably lower than $1\times10^{11}/cm^3$, and further preferably lower than $1\times10^{10}/cm^3$ and higher than or equal to $1\times10^{-9}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause deterioration of the electric characteristics of the transistor. Therefore, it is preferable to reduce the concentration of the impurities in the semiconductors 521, 522, and 523 and at interfaces between the semiconductors.

For example, a region with a silicon concentration of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$ is provided between the semiconductor 522 and the semiconductor 521. In addition, a region with a silicon concentration of higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, and further preferably higher than or equal to $1\times10^{16}$ atoms/cm$^3$ and lower than $2\times10^{18}$ atoms/cm$^3$ is provided between the semiconductor 522 and the semiconductor 523. The silicon concentration can be measured by, for example, SIMS.

It is preferable to reduce the concentration of hydrogen in the semiconductors 521 and 523 in order to reduce the concentration of hydrogen in the semiconductor 522. The semiconductors 521 and 523 each have a region in which the concentration of hydrogen is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. The hydrogen concentration can be measured by, for example, SIMS.

It is preferable to reduce the concentration of nitrogen in the semiconductors 521 and 523 in order to reduce the concentration of nitrogen in the semiconductor 522. The semiconductors 521 and 523 each have a region in which the concentration of nitrogen is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, and still further preferably higher than or equal to $1\times10^{16}$ atoms/cm$^3$ and lower than or equal to $5\times10^{17}$ atoms/cm$^3$. The nitrogen concentration can be measured by SIMS.

A transistor in which the above highly purified oxide semiconductor is used for a channel formation region exhibits an extremely low off-state current. When a source-drain voltage is, for example, about 0.1 V, 5 V, or 10 V, the off-state current standardized on the channel width of the transistor can be as low as several yoctoamperes per micrometer to several zeptoamperes per micrometer.

FIGS. 18A to 18D show an example of the three-layer semiconductor region 520; however, one embodiment of the present invention is not limited thereto. For example, the semiconductor region 520 may have a two-layer structure without the semiconductor 521 or the semiconductor 523. Alternatively, the semiconductor region 520 may have a four-layer structure in which a semiconductor similar to any one of the semiconductors 521 to 523 is provided below or over the semiconductor 521 or below or over the semiconductor 523. Alternatively, the semiconductor region 520 may have an n-layer structure (n is an integer of 5 or more) in which a semiconductor similar to any one of the semiconductors 521 to 523 is provided at two or more of the following positions: over the semiconductor 521, below the semiconductor 521, over the semiconductor 523, and below the semiconductor 523.

In the case where the OS transistor 581 does not include a back gate electrode, the conductor 533 need not be provided. In that case, the insulator 513 may be formed over the insulator 511 without the insulator 512.

<Substrate>

As the substrate 510, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a single material semiconductor substrate made of silicon, germanium, or the like; and a compound semiconductor substrate made of silicon carbide, silicon germanium, gallium arsenide, indium phosphide, zinc oxide, or gallium oxide. The semiconductor substrate may be a bulk substrate or a silicon on insulator (SOI) substrate in which a semiconductor is provided over a semiconductor substrate with an insulating region positioned therebetween. Examples of the conductor substrate include a graphite substrate, a metal substrate, an alloy substrate, and a conductive resin substrate. A substrate including a metal nitride, a substrate including a metal oxide, or the like may also be used. Furthermore, an insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate 510. To provide a transistor over a flexible substrate, the transistor may be formed over a non-flexible substrate (e.g., a semiconductor substrate) and then separated and transferred to the substrate 510 which is a flexible substrate. In that case, a separation layer is preferably provided between the non-flexible substrate and the transistor. As the substrate 510, a sheet, a film, or a foil containing a fiber may be used. The substrate 510 may have elasticity. The substrate 510 may have a property of returning to its original shape when bending or pulling is stopped. Alternatively, the substrate 510 may have a property of not returning to its original shape. The thickness of the substrate 510 is, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate 510 has a small thickness, the weight of the semiconductor device can be reduced. When the substrate 510 has a small thickness, even in the case of using glass or the like, the substrate 510 may have elasticity or a property of returning to its original shape when bending or pulling is stopped. Therefore, an impact applied to the semiconductor device over the substrate 510, which is caused by dropping or the like, can be reduced. That is, a robust semiconductor device can be provided.

For the substrate 510 which is a flexible substrate, for example, metal, an alloy, resin, glass, or fiber thereof can be used. The flexible substrate 510 preferably has a lower coefficient of linear expansion because deformation due to an environment is suppressed. The flexible substrate 510 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 510 because of its low coefficient of linear expansion.

<Structure Example 2 of OS Transistor>

Figure 20A:
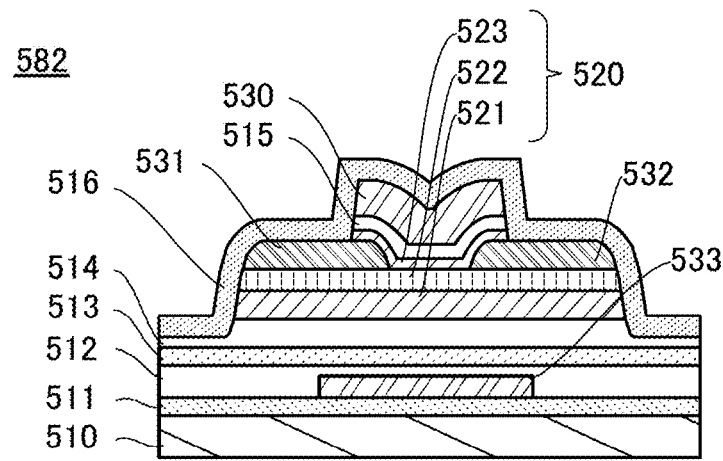
FIGS. 20A to 20C are cross-sectional views each illustrating a structure example of an OS transistor.

In the OS transistor 581 illustrated in FIG. 18A, the semiconductor 523 and the insulator 515 can be etched with the conductor 530 used as a mask. FIG. 20A illustrates a structure example of the OS transistor manufactured through such a process. In an OS transistor 582 illustrated in FIG. 20A, edges of the semiconductor 523 and the insulator 515 are substantially aligned with an edge of the conductor 530. The semiconductor 523 and the insulator 515 are positioned only under the conductor 530.

<Structure Example 3 of OS Transistor>

Figure 20B:
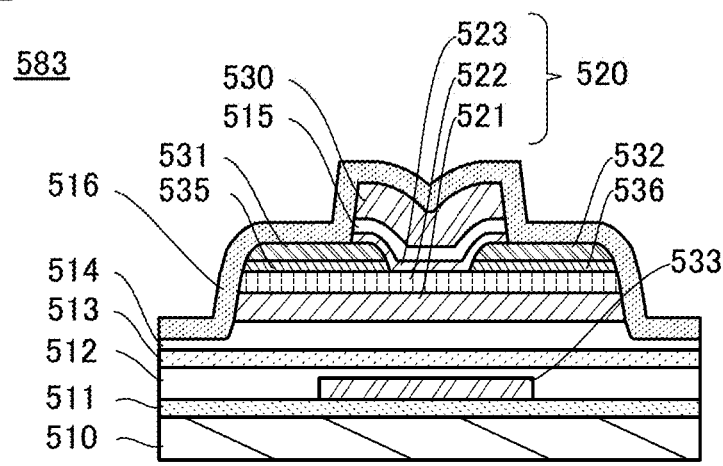

An OS transistor 583 illustrated in FIG. 20B has a device structure in which a conductor 535 and a conductor 536 are added to the OS transistor 582. A pair of electrodes serving as a source and a drain electrode of the OS transistor 583 include a stack of the conductors 535 and 531 and a stack of the conductors 536 and 532.

Each of the conductors 535 and 536 includes a single-layer or multilayer conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may also be used, and a conductor containing aluminum, a conductor containing copper and titanium, a conductor containing copper and manganese, a conductor containing indium, tin, and oxygen, a conductor containing titanium and nitrogen, or the like may be used.

The conductors 535 and 536 may have a property of transmitting visible light. Alternatively, the conductors 535 and 536 may have a property of not transmitting visible light, ultraviolet light, infrared light, or X-rays by reflecting or absorbing it. In some cases, such a property can suppress a change in the electric characteristics of the OS transistor 583 due to stray light.

The conductors 535 and 536 may preferably be formed using a layer that does not form a Schottky barrier with the semiconductor 522 or the like. Accordingly, the on-state characteristics of the OS transistor 583 can be improved.

Note that the conductors 535 and 536 may preferably have higher resistance than the conductors 531 and 532. The conductors 535 and 536 may preferably have a resistance lower than that of a channel of the OS transistor 583 (specifically, the semiconductor 522). For example, the conductors 535 and 536 may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductors 535 and 536 having a resistivity within the above range can reduce electric field concentration in a boundary portion between the channel and the drain. This suppresses a change in the electric characteristics of the OS transistor 583. In addition, a punch-through current generated by an electric field from the drain can be reduced. Thus, a transistor with a small channel length can have favorable saturation characteristics. Note that in a circuit configuration where the source and the drain do not interchange, only one of the conductors 535 and 536 (e.g., the layer on the drain side) may preferably be provided.

<Structure Example 4 of OS Transistor>

Figure 20C:
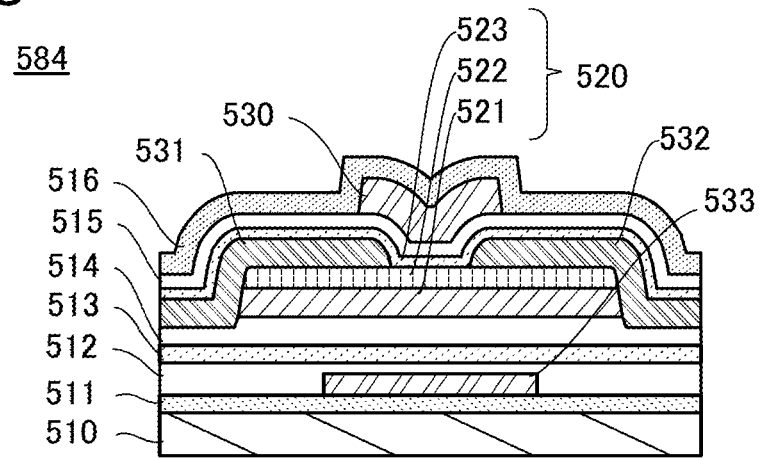

In the OS transistor 581 illustrated in FIGS. 18A to 18D, the conductors 531 and 532 may be in contact with side surfaces of the semiconductors 521 and 522. FIG. 20C illustrates an example of such a structure. In an OS transistor 584 illustrated in FIG. 20C, the conductors 531 and 532 are in contact with the side surfaces of the semiconductors 521 and 522.

<Heat Dissipation Method of OS Transistor>

An oxide semiconductor containing indium, zinc, and gallium has a low thermal conductivity; hence, when a transistor including the oxide semiconductor continues to be driven, the reliability of the transistor decreases due to self-heating in some cases. Therefore, the transistor preferably has a structure allowing dissipation of heat generated by driving.

In FIG. 20C, the area where the conductors 531 and 532 are in contact with the semiconductor region 520 is increased so that heat generated from the semiconductor region 520 is dissipated to the conductors 531 and 532. Although not illustrated, when the area where the conductor 531 is in contact with the conductors 531 and 532 is increased, heat is also dissipated to the conductor 530.

Embodiment 4

Described in this embodiment is a structure of an oxide semiconductor film capable of being used for the OS transistors described in the above embodiments.

<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned and a-b-plane anchored crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 21A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 21B, a peak is not clearly observed. In contrast, in the case where single crystal $InGaZnO_4$ is subjected to φ scan with 2θ fixed at around 56°, as shown in FIG. 21C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 21D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 21E shows a diffraction pattern obtained in such a manner that an electron beam with a probe diameter of 300 nm is incident on the same sample in a direction perpendicular to the sample surface. As shown in FIG. 21E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 21E is considered to be derived from the (010) plane, the (100) plane, and the like of the $InGaZnO_4$ crystal. The second ring in FIG. 21E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 22A:
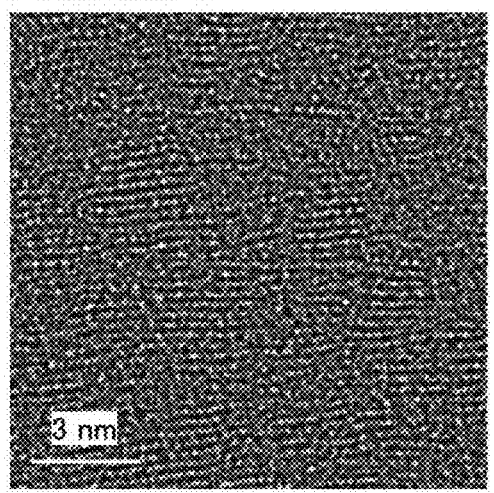
FIGS. 22A to 22E show a cross-sectional TEM image and plan-view TEM images of a CAAC-OS and images obtained through analysis thereof.

FIG. 22A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 22A shows pellets in which metal atoms are arranged in a layered manner. FIG. 22A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 22B:
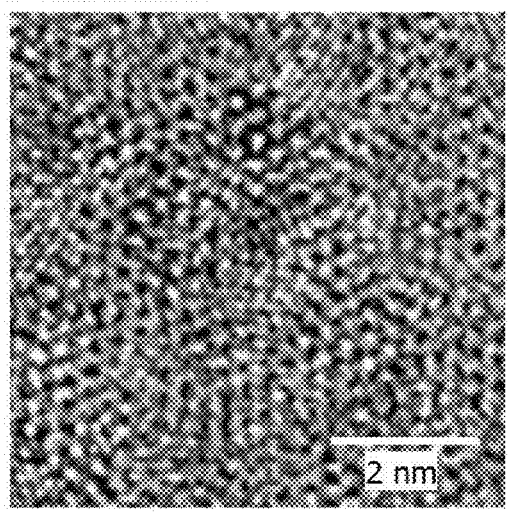
Figure 22C:
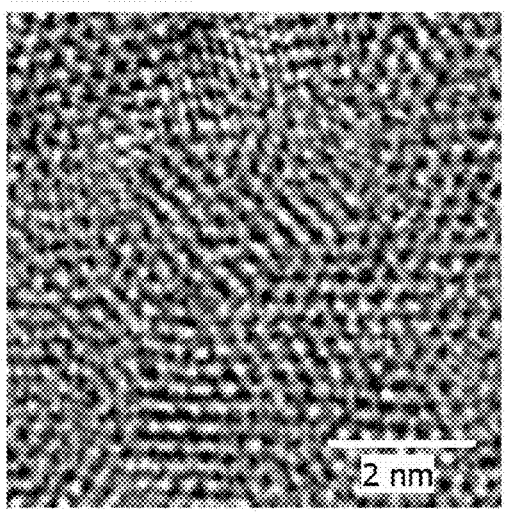
Figure 22D:
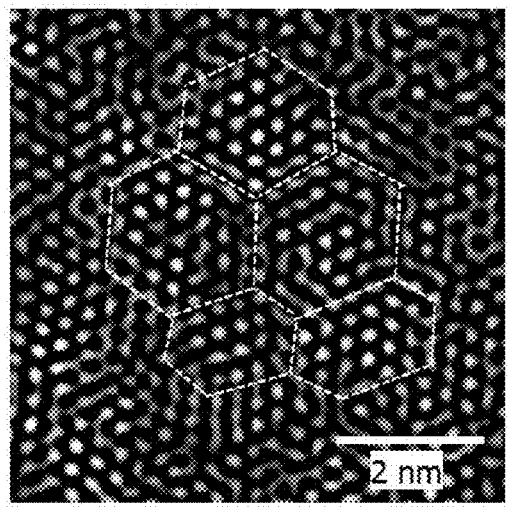
Figure 22E:
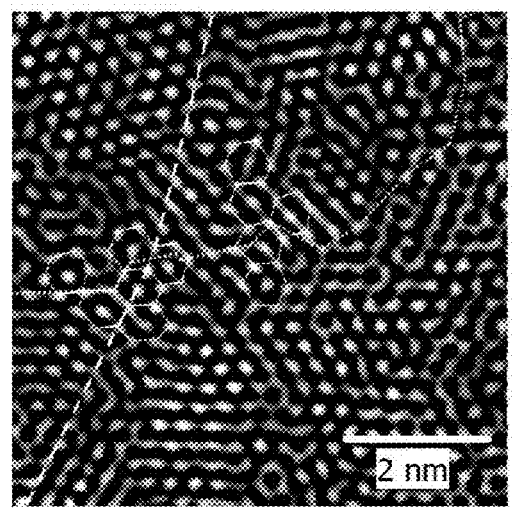

FIGS. 22B and 22C show Cs-corrected high-resolution TEM images of a plane of the CAAC-OS observed from a direction substantially perpendicular to the sample surface. FIGS. 22D and 22E are images obtained through image processing of FIGS. 22B and 22C. The method of image processing is as follows. The image in FIG. 22B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 22D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 22E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor film with a low carrier density; specifically, lower than $8 \times 10^{11}/cm^3$, preferably lower than $1 \times 10^{11}/cm^3$, and further preferably lower than $1 \times 10^{10}/cm^3$ and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 23A:
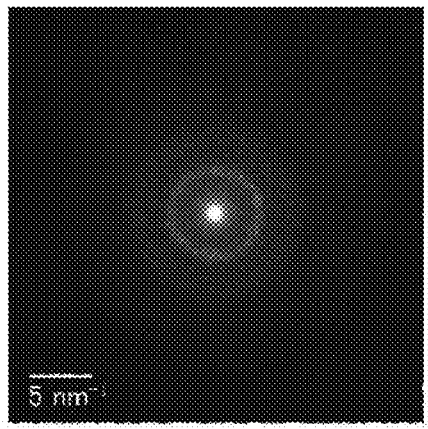
FIGS. 23A to 23D show electron diffraction patterns and a cross-sectional TEM image of an nc-OS.
Figure 23B:
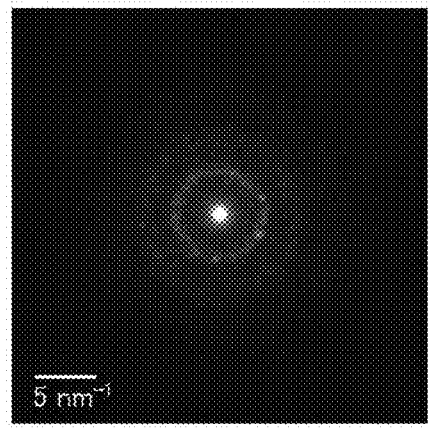

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 23A is observed. FIG. 23B shows a diffraction pattern obtained when an electron beam with a probe diameter of 1 nm is incident on the same sample. As shown in FIG. 23B, a plurality of spots are observed in a ring-like region. In other words, ordering in an nc-OS is not observed with an electron beam with a probe diameter of 50 nm but is observed with an electron beam with a probe diameter of 1 nm.

Figure 23C:
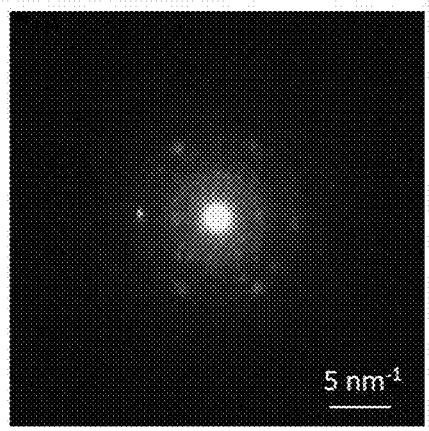

Furthermore, an electron diffraction pattern in which spots are arranged in an approximately hexagonal shape is observed in some cases as shown in FIG. 23C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 23D:
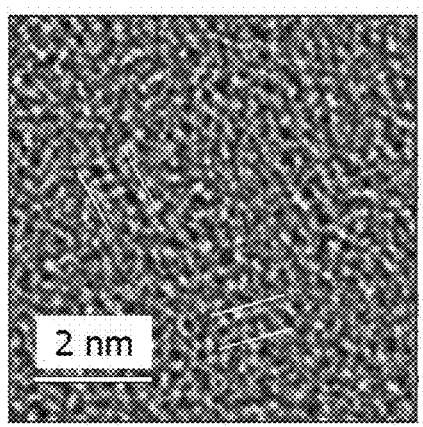

FIG. 23D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 23D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

Figure 24A:
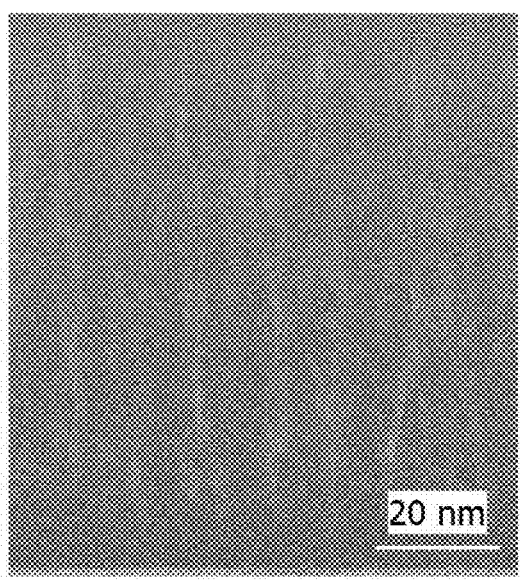
FIGS. 24A and 24B show cross-sectional TEM images of an a-like OS.
Figure 24B:
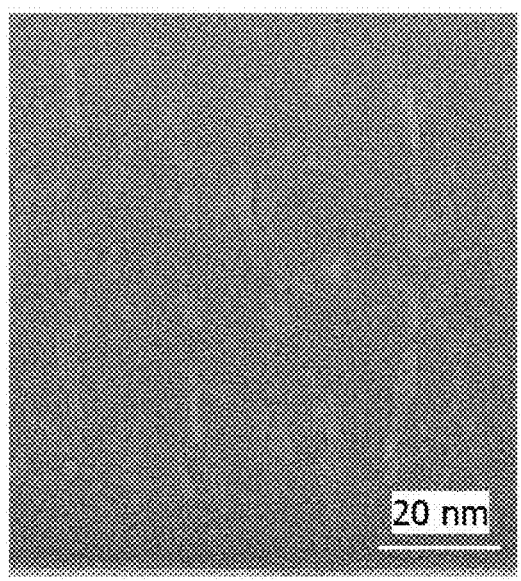

FIGS. 24A and 24B are high-resolution cross-sectional TEM images of an a-like OS. FIG. 24A is the high-resolution cross-sectional TEM image of the a-like OS at the start of the electron irradiation. FIG. 24B is the high-resolution cross-sectional TEM image of a-like OS after the electron ($e^-$) irradiation at $4.3 \times 10^8$ $e/nm^2$. FIGS. 24A and 24B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 25:
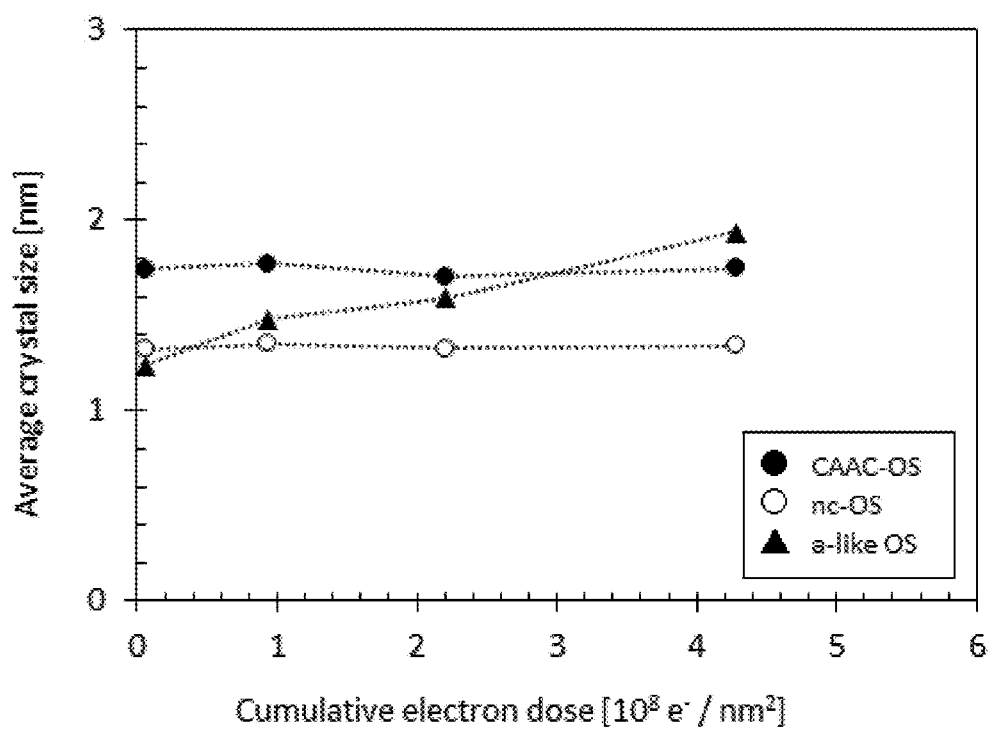
FIG. 25 shows a change of crystal parts of an In—Ga—Zn oxide due to electron irradiation

FIG. 25 shows change in the average size of crystal parts (at 22 points to 30 points) in each sample. Note that the crystal part size corresponds to the length of a lattice fringe. FIG. 25 indicates that the crystal part size in the a-like OS increases with an increase in the cumulative electron dose in obtaining TEM images, for example. As shown in FIG. 25, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e/nm$^2$. As shown in FIG. 25, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2 \cdot$s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

This embodiment can be combined as appropriate with any of the other embodiments described in this specification.

Embodiment 5

In this embodiment, application examples of the semiconductor device described in the foregoing embodiments to an electronic component and to an electronic device including the electronic component will be described with reference to FIGS. 26A and 26B and FIGS. 27A to 27F.

<Electronic Component>

Figure 26A:
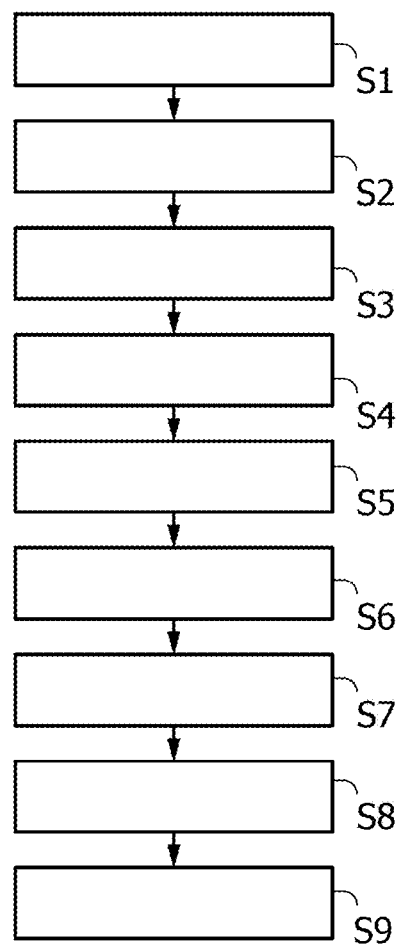
FIGS. 26A and 26B are a flow chart and a perspective view showing one embodiment of the present invention.

FIG. 26A shows an example where the semiconductor device described in the foregoing embodiments is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors as shown in Embodiment 1 is completed by integrating detachable components on a printed circuit board through the assembly process (post-process).

The post-process can be completed through steps shown in FIG. 26A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device described in the foregoing embodiments, it is possible to obtain a highly reliable electronic component.

Figure 26B:
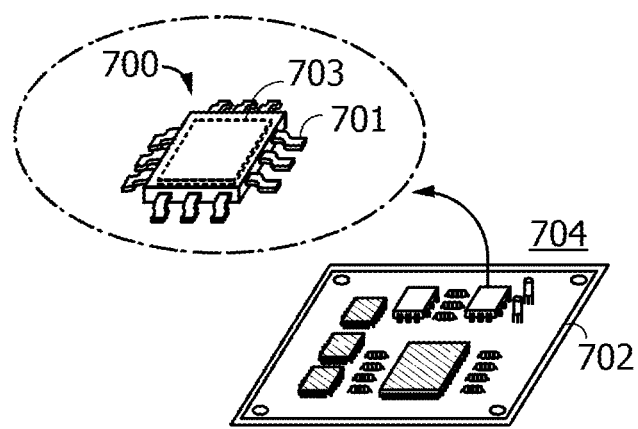

FIG. 26B is a schematic perspective view of a completed electronic component. FIG. 26B shows a schematic perspective view of a quad flat package (QFP) as an example of the electronic component. An electronic component 700 illustrated in FIG. 26B includes a lead 701 and a circuit portion 703. The electronic component 700 in FIG. 26B is, for example, mounted on a printed circuit board 702. A combination of electronic components 700 electrically connected to each other over the printed circuit board 702 can be equipped in an electronic device. A completed circuit board 704 is provided in an electronic device or the like.

<Electronic Device>

Next, electronic devices including the aforementioned electronic component will be described.

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), vending machines, and medical devices. FIGS. 27A to 27F illustrate specific examples of these electronic devices.

Figure 27A:
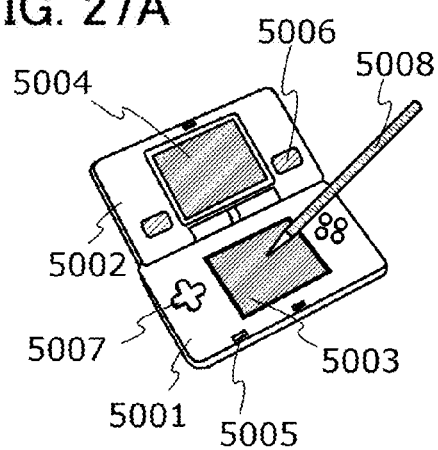
FIGS. 27A to 27F illustrate electronic devices of one embodiment of the present invention.

FIG. 27A illustrates a portable game machine which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 27A has the two display portions 5003 and 5004, the number of display portions included in a portable game machine is not limited to two.

Figure 27B:
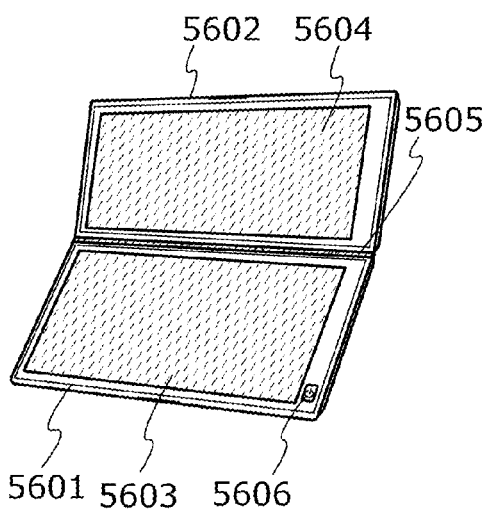

FIG. 27B illustrates a portable information terminal which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as the first display portion 5603 and/or the second display portion 5604. Note that the position input function can be added by providing a touch panel in a display device. Alternatively, the position input function can be added by providing a photoelectric conversion element called a photosensor in a pixel portion of a display device.

Figure 27C:
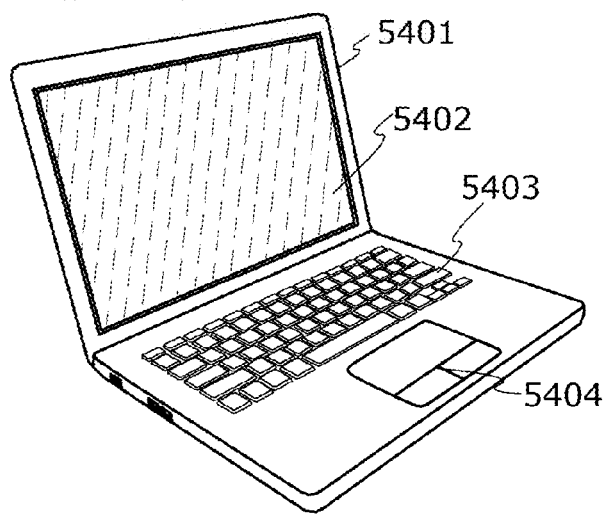

FIG. 27C illustrates a laptop which includes a housing 5401, a display portion 5402, a keyboard 5403, a pointing device 5404, and the like. The semiconductor device of one embodiment of the present invention can be used for a variety of integrated circuits included in laptops.

Figure 27D:
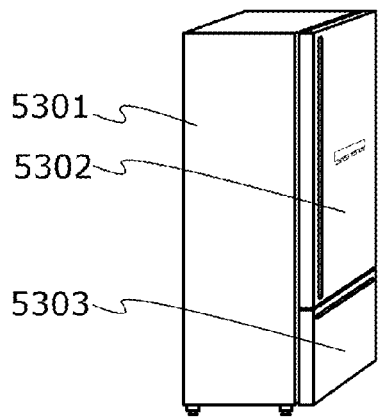

FIG. 27D illustrates an electric refrigerator-freezer which includes a housing 5301, a refrigerator door 5302, a freezer door 5303, and the like. The semiconductor device of one embodiment of the present invention can be used for a variety of integrated circuits included in electric refrigerator-freezers.

Figure 27E:
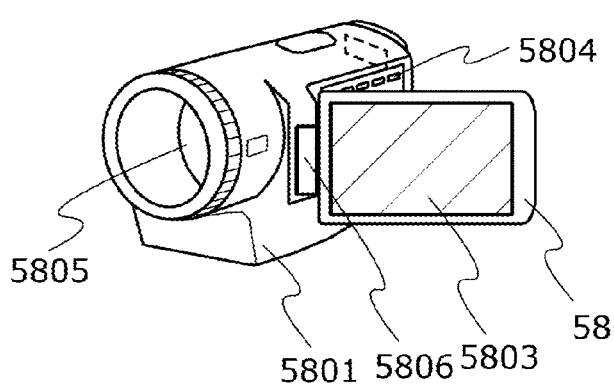

FIG. 27E illustrates a video camera which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 27F:
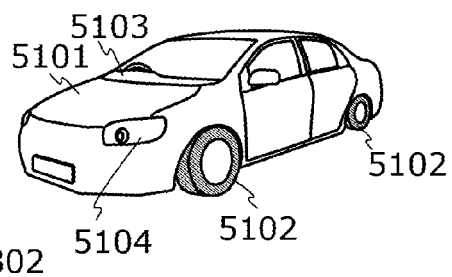

FIG. 27F illustrates a car which includes a car body 5101, wheels 5102, a dashboard 5103, lights 5104, and the like. The semiconductor device of one embodiment of the present invention can be used for a variety of integrated circuits included in cars.

This application is based on Japanese Patent Application serial No. 2014-250551 filed with Japan Patent Office on Dec. 11, 2014, the entire contents of which are hereby incorporated by reference.

EXPLANATION OF REFERENCE

MC[i]: memory cell, MC[1]: memory cell, MC[2]: memory cell, MC[n]: memory cell, MC: memory cell, pMC[i]: memory cell, MC[1,1]: memory cell, MC[m,1]: memory cell, MC[1,$n$]: memory cell, MC[m,n]: memory cell, MCC: circuit unit, MCC[1]: circuit unit, MCC[m]: circuit unit, MCC[1,1]: circuit unit, MCC[m,1]: circuit unit, MCC[1,$n$]: circuit unit, MCC[m,n]: circuit unit, MCA: memory cell array, MCS: circuit unit, MCS[1]: circuit unit, MCS[m]: circuit unit, MCS[1,1]: circuit unit, MCS[m,1]: circuit unit, MCS[1,$n$]: circuit unit, MCS[m,n]: circuit unit, MCSS: circuit unit, Si—C: circuit unit, TRA[i]: transistor, TRA[1]: transistor, TRA[2]: transistor, TRA[n]: transistor, TRB[i]: transistor, TRB[1]: transistor, TRB[2]: transistor, TRB[n]: transistor, BGA[i]: back gate, BGA[1]: back gate, BGA[2]: back gate, BGA[n]: back gate, BGB[i]: back gate, BGB[1]: back gate, BGB[2]: back gate, BGB[n]: back gate, pTRA[i]: transistor, pTRB[i]: transistor, SW: transistor, SW[1]: transistor, SW[m]: transistor, SW[1,1]: transistor, SW[m,1]: transistor, SW[1,$n$]: transistor, SW[m,n]: transistor, C[i]: capacitor, C[1]: capacitor, C[2]: capacitor, C[n]: capacitor, FN[i]: node, FN[1]: node, FN[2]: node, FN[n]: node, CNODE[i]: wiring, CNODE[1]: wiring, CNODE[2]: wiring, CNODE[n]: wiring, CNODE[1,1]: wiring, CNODE[1,$n$]: wiring, CNODE[m,1]: wiring, CNODE[m,n]: wiring, CNODE(1)[1]: wiring, CNODE(k)[1]: wiring, CNODE(1)[$n$]: wiring, CNODE(k)[n]: wiring, D[i]: wiring, S[i]: wiring, WBL[i]: wiring, WBL[1]: wiring, WBL[2]: wiring, WBL[n]: wiring, WBL(1)[1]: wiring, WBL(k)[1]: wiring, WBL(1)[n]: wiring, WBL(k)[n]: wiring, WL: wiring, WL[1]: wiring, WL[m]: wiring, SWG: wiring, SWG[1]: wiring, SWG[m]: wiring, SWG[1,1]: wiring, SWG[m,1]: wiring, SWG[1,n]: wiring, SWG[m,n]: wiring, NA: node, NA[1]: node, NA[m]: node, NA[1,1]: node, NA[m,1]: node, NA[1,n]: node, NA[m,n]: node, NB: node, NB[1]: node, NB[m]: node, NB[1,1]: node, NB[m,1]: node, NB[1,n]: node, NB[m,n]: node, 101a: semiconductor, 101b: semiconductor, 102: conductor, 103a: conductor, 103b: conductor, 104a: conductor, 104b: conductor, 105a: conductor, 105b: conductor, 106: conductor, 107: conductor, 108: conductor, 110: semiconductor device, 120: semiconductor device, 160: semiconductor device, 170: semiconductor device, 180: semiconductor device, 190: semiconductor device, 510: substrate, 511: insulator, 512: insulator, 513: insulator, 514: insulator, 515: insulator, 516: insulator, 520: semiconductor region, 521: semiconductor, 522: semiconductor, 523: semiconductor, 530: conductor, 531: conductor, 532: conductor, 533: conductor, 535: conductor, 536: conductor, 700: electronic component, 701: lead, 702: printed circuit board, 703: circuit portion, 704: circuit board, 581: OS transistor, 582: OS transistor, 583: OS transistor, 584: OS transistor, 2600: memory device, 2601: peripheral circuit, 2610: memory cell array, 2621: row decoder, 2622: word line driver circuit, 2630: bit line driver circuit, 2631: column decoder, 2632: precharge circuit, 2633: sense amplifier, 2634: write circuit, 2640: output circuit, 2660: control logic circuit, 5001: housing, 5002: housing, 5003: display portion, 5004: display portion, 5005: microphone, 5006: speaker, 5007: operation key, 5008: stylus, 5101: car body, 5102: wheels, 5103: dashboard, 5104: light, 5301: housing, 5302: refrigerator door, 5303: freezer door, 5401: housing, 5402: display portion, 5403: keyboard, 5404: pointing device, 5601: first housing, 5602: second housing, 5603: first display portion, 5604: second display portion, 5605: joint, 5606: operation key, 5801: first housing, 5802: second housing, 5803: display portion, 5804: operation key, 5805: lens, 5806: joint

The invention claimed is:

1. A semiconductor device comprising a first circuit,
the first circuit comprising a first input terminal, a first output terminal, a first transistor, and a second circuit, and
the second circuit comprising a second to a (2n+1)th transistor, a first to an n-th capacitor, a first to an n-th wiring, a first gate wiring, and a first to an n-th storage node (n is an integer of 2 or more),
wherein a gate of the 2i-th transistor is electrically connected to the first gate wiring (i is an integer of 1 to n),
wherein a first terminal of the 2i-th transistor is electrically connected to a gate of the (2i+1)th transistor and a first terminal of the i-th capacitor through the i-th storage node,
wherein the first wiring is electrically connected to a second terminal of the first transistor,
wherein the i-th wiring is electrically connected to a second terminal of the 2i-th transistor,
wherein the first input terminal is electrically connected to a first terminal of the first transistor,
wherein a second terminal of the first transistor is electrically connected to a first terminal of the third transistor,
wherein a second terminal of a (2i−1)th transistor is electrically connected to a first terminal of the (2i+1)th transistor, and
wherein a second terminal of the (2n+1)th transistor is electrically connected to the first output terminal.

2. The semiconductor device according to claim 1, comprising a memory cell array and a plurality of the first circuits,
wherein the memory cell array comprises a plurality of the second circuits.

3. The semiconductor device according to claim 1, comprising a plurality of memory cell arrays and a plurality of the first circuits,
wherein the plurality of memory cell arrays each comprises a plurality of the second circuits, and
wherein the plurality of memory cell arrays overlap with each other.

4. The semiconductor device according to claim 1, comprising a third circuit,
wherein the third circuit is configured to supply a potential to the first circuit and read a potential output from the first circuit,
wherein the first input terminal is electrically connected to the third circuit, and
wherein the first output terminal is electrically connected to the third circuit.

5. The semiconductor device according to claim 4, wherein the second circuit is over the third circuit.

6. The semiconductor device according to claim 1, wherein the first to the (2n+1)th transistor include an oxide semiconductor in a channel formation region.

7. The semiconductor device according to claim 1, wherein the first transistor includes silicon in a channel formation region, and
wherein the second to the (2n+1)th transistor include an oxide semiconductor in a channel formation region.

8. The semiconductor device according to claim 1, wherein at least one of the first to the (2n+1)th transistor includes a back gate.

9. The semiconductor device according to claim 1, wherein the first to the n-th storage node are configured to retain M-bit data (M is an integer of 1 or more) as a potential and output, from the first output terminal, a potential corresponding to the potential maintained at the first to the n-th storage node.

10. A semiconductor device comprising a first circuit,
the first circuit comprising a first input terminal, a first output terminal, a first transistor, and a second circuit, and
the second circuit comprising a second to a (2n+1)th transistor, a first to an n-th capacitor, a first to an n-th wiring, a first gate wiring, and a first to an n-th storage node (n is an integer of 2 or more),
wherein a gate of the 2i-th transistor is electrically connected to the first gate wiring (i is an integer of 1 to n),
wherein a first terminal of the 2i-th transistor is electrically connected to a gate of the (2i+1)th transistor and a first terminal of the i-th capacitor through the i-th storage node,
wherein the first wiring is electrically connected to a second terminal of the first transistor,
wherein the i-th wiring is electrically connected to a second terminal of the 2i-th transistor,
wherein the first input terminal is electrically connected to a first terminal of the third transistor,
wherein a second terminal of a (2i−1)th transistor is electrically connected to a first terminal of the (2i+1)th transistor,
wherein a second terminal of the (2n+1)th transistor is electrically connected to a first terminal of the first transistor, and wherein a second terminal of the first transistor is electrically connected to the first output terminal.

11. The semiconductor device according to claim 10, comprising a memory cell array and a plurality of the first circuits,
wherein the memory cell array comprises a plurality of the second circuits.

12. The semiconductor device according to claim 10, comprising a plurality of memory cell arrays and a plurality of the first circuits,
wherein the plurality of memory cell arrays each comprises a plurality of the second circuits, and
wherein the plurality of memory cell arrays overlap with each other.

13. The semiconductor device according to claim 10, comprising a third circuit,
wherein the third circuit is configured to supply a potential to the first circuit and read a potential output from the first circuit,
wherein the first input terminal is electrically connected to the third circuit, and
wherein the first output terminal is electrically connected to the third circuit.

14. The semiconductor device according to claim 13, wherein the second circuit is over the third circuit.

15. The semiconductor device according to claim 10, wherein the first to the (2n+1)th transistor include an oxide semiconductor in a channel formation region.

16. The semiconductor device according to claim 10, wherein the first transistor includes silicon in a channel formation region, and
wherein the second to the (2n+1)th transistor include an oxide semiconductor in a channel formation region.

17. The semiconductor device according to claim 10, wherein at least one of the first to the (2n+1)th transistor includes a back gate.

18. The semiconductor device according to claim 10, wherein the first to the n-th storage node are configured to retain M-bit data (M is an integer of 1 or more) as a potential and output, from the first output terminal, a potential corresponding to the potential maintained at the first to the n-th storage node.

19. A semiconductor device comprising:
a first transistor comprising a gate, a first terminal, and a second terminal,
a first memory cell comprising a first capacitor, a second transistor and a third transistor each comprising a gate, a first terminal, and a second terminal;
a second memory cell comprising a second capacitor, a fourth transistor and a fifth transistor each comprising a gate, a first terminal, and a second terminal;
a first wiring and a second wiring; and
a circuit comprising an input terminal and an output terminal,
wherein the first terminal of the second transistor is electrically connected to the first wiring,
wherein the first terminal of the fourth transistor is electrically connected to the second wiring,
wherein the second terminal of the second transistor is electrically connected to a first terminal of the first capacitor,
wherein the second terminal of the fourth transistor is electrically connected to a first terminal of the second capacitor,
wherein the output terminal is electrically connected to the first terminal of the first transistor,
wherein the second terminal of the first transistor is electrically connected to the first terminal of the third transistor,
wherein the second terminal of the third transistor is electrically connected to the first terminal of the fifth transistor, and
wherein the second terminal of the fifth transistor is electrically connected to the input terminal.

20. The semiconductor device according to claim 19, further comprising:
third to fifth wirings,
wherein the third wiring is electrically connected to the gate of the second transistor and the gate of the fourth transistor,
wherein the fourth wiring is electrically connected to a second terminal of the first capacitor,
wherein the fifth wiring is electrically connected to a second terminal of the second capacitor,
wherein the second terminal of the second transistor is electrically connected to the gate of the third transistor, and
wherein the second terminal of the fourth transistor is electrically connected to the gate of the fifth transistor.

21. The semiconductor device according to claim 19, wherein at least one of the second to fifth transistors includes a back gate.

22. The semiconductor device according to claim 19, wherein the first to fifth transistors include an oxide semiconductor in a channel formation region.

* * * * *